(12) United States Patent
Han et al.

(10) Patent No.: US 11,387,433 B2
(45) Date of Patent: Jul. 12, 2022

(54) APPARATUS AND METHOD FOR MANUFACTURING DISPLAY DEVICE

(71) Applicant: SAMSUNG DISPLAY CO., LTD., Yongin-si (KR)

(72) Inventors: Jeongwon Han, Yongin-si (KR); Jongsung Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 25 days.

(21) Appl. No.: 16/812,566

(22) Filed: Mar. 9, 2020

(65) Prior Publication Data

US 2021/0005839 A1 Jan. 7, 2021

(30) Foreign Application Priority Data

Jul. 1, 2019 (KR) ........................ 10-2019-0078952

(51) Int. Cl.
| | | |
|---|---|---|
| *H01L 51/52* | (2006.01) | |
| *B65H 18/14* | (2006.01) | |
| *H01L 51/56* | (2006.01) | |
| *H01L 27/32* | (2006.01) | |
| *H01L 51/00* | (2006.01) | |

(52) U.S. Cl.
CPC ....... *H01L 51/5253* (2013.01); *B65H 18/145* (2013.01); *H01L 27/3244* (2013.01); *H01L 51/0097* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 7,708,483 B2 | 5/2010 | Samii et al. | |
| 9,172,063 B2 | 10/2015 | Hamada et al. | |
| 2012/0219340 A1* | 8/2012 | Rumsby | ................ H01L 31/206 400/76 |
| 2014/0272109 A1* | 9/2014 | Martensson | ............ B05C 5/027 427/8 |

FOREIGN PATENT DOCUMENTS

| | | |
|---|---|---|
| KR | 101506357 B1 | 3/2015 |
| KR | 101540350 B1 | 7/2015 |
| KR | 1020160083420 A | 7/2016 |
| KR | 1020170051466 A | 5/2017 |
| KR | 101906129 B1 | 10/2018 |
| WO | 2016036646 A1 | 3/2016 |

OTHER PUBLICATIONS

Web Handling: Top 7 Causes of Wrinkles, 2011, 4pages, https://pffc-online.com/web-handling/9810-web-handling-top-7-causes-wrinkles-1010, retreived on Sep. 24, 2019.

\* cited by examiner

*Primary Examiner* — J. E. Schoenholtz
(74) *Attorney, Agent, or Firm* — Cantor Colburn LLP

(57) ABSTRACT

An apparatus for manufacturing a display device includes a first roller from which a film member is unwound, a second roller around which the film member is wound, a flatness maintainer that is arranged between the first roller and the second roller and keeps at least one of an upper surface and a lower surface of the film member, flat, and a sensing unit arranged on at least one of the upper surface of the film member and the lower surface of the film member and detecting droplets dropped from a head unit onto the film member.

25 Claims, 20 Drawing Sheets

APPARATUS AND METHOD FOR MANUFACTURING DISPLAY DEVICE

This application claims priority to Korean Patent Application No. 10-2019-0078952, filed on Jul. 1, 2019, and all the benefits accruing therefrom under 35 U.S.C. § 119, the content of which in its entirety is herein incorporated by reference.

BACKGROUND

1. Field

One or more exemplary embodiments relate to an apparatus and a method, and more particularly, to an apparatus and a method for manufacturing a display device.

2. Description of the Related Art

Mobile electronic devices have been widely used. As examples of mobile electronic devices, tablet personal computers ("PCs") recently have been widely used besides compact devices such as mobile phones.

The mobile electronic devices described above include a display device which provides a user with visual information such as images or pictures to support various functions. Recently, as other components for driving the display device have become compact, a usage of the display device in an electronic device is gradually increasing and a display device that is bendable from a flat state at an angle has also been developed.

SUMMARY

One or more exemplary embodiments include an apparatus and a method for manufacturing a display device.

Additional exemplary embodiments will be set forth in part in the description which follows and, in part, will be apparent from the description, or may be learned by practice of the presented embodiments of the invention.

An exemplary embodiment of a method of manufacturing a display device includes moving a film member by rotating one of a first roller unwinding the film member and a second roller around which the film member is wound, stopping the film member by stopping at least one of the first roller and the second roller, tensioning the film member by clamping a side of the film member, discharging droplets onto the film member, and detecting the droplets on the film member.

In an exemplary embodiment, the method may further include controlling droplets discharged from a head unit based on a result of the detecting the droplets.

In an exemplary embodiment, at least one of a size, a volume, a position, and a shape of the droplets may be detected.

In an exemplary embodiment, a force may be applied to the side of the film member at at least one side portion of the film member in a direction perpendicular to a transport direction of the film member.

In an exemplary embodiment, the method may further include supporting the film member on a lower surface of the film member.

In an exemplary embodiment, the lower surface of the film member may be supported using a support chuck.

In an exemplary embodiment, the support chuck may include at least one of a vacuum chuck and a porous chuck.

In an exemplary embodiment, a portion of the support chuck arranged to face the lower surface of the film member may be transparent.

In an exemplary embodiment, the method may further include capturing an image of the droplets by a sensing unit to detect the droplets.

In an exemplary embodiment, the sensing unit may be arranged on at least one of an upper surface of the film member and a lower surface of the film member.

An exemplary embodiment of a method of manufacturing a display device includes moving a film member by rotating one of a first roller unwinding the film member and a second roller around which the film member is wound, stopping the film member by stopping at least one of the first roller and the second roller, keeping the film member flat by ejecting inert gas onto an upper surface of the film member, discharging droplets onto the film member, and detecting the droplets on the film member.

In an exemplary embodiment, the method may further include controlling droplets discharged from a head unit based on a result of the detecting the droplets.

In an exemplary embodiment, at least one of a size, a volume, a position, and a shape of the droplets may be detected.

In an exemplary embodiment, the method may further include supporting the film member on a lower surface of the film member.

In an exemplary embodiment, the lower surface of the film member may be supported using a support chuck.

In an exemplary embodiment, the support chuck may include at least one of a vacuum chuck and a porous chuck.

In an exemplary embodiment, a portion of the support chuck arranged to face the lower surface of the film member may be transparent.

In an exemplary embodiment, the method may further include capturing an image of the droplets by a sensing unit to detect the droplets.

In an exemplary embodiment, the sensing unit may be arranged on at least one of the upper surface of the film member and the lower surface of the film member.

An exemplary embodiment of an apparatus for manufacturing a display device includes a head unit, a first roller from which a film member is unwound, a second roller around which the film member is wound, a flatness maintainer that is arranged between the first roller and the second roller and keeps at least one of an upper surface and a lower surface of the film member, flat, and a sensing unit which is arranged on at least one of the upper surface of the film member and the lower surface of the film member and detects droplets dropped from the head unit onto the film member.

In an exemplary embodiment, the flatness maintainer may include a clamping unit applying a force to a side of the film member.

In an exemplary embodiment, the clamping unit may apply a force to the film member in a direction perpendicular to a transport direction of the film member.

In an exemplary embodiment, the apparatus further includes a plurality of clamping units, and the plurality of clamping units may be arranged to be spaced apart from each other in a transport direction of the film member.

In an exemplary embodiment, the flatness maintainer may include a gas ejecting unit which is arranged on the upper surface of the film member and ejects inert gas onto the upper surface of the film member.

In an exemplary embodiment, the flatness maintainer may include a support chuck which is arranged on the lower surface of the film member and contacts the lower surface of the film member to support the lower surface of the film member.

In an exemplary embodiment, a position of the sensing unit may be variable.

In addition to the aforesaid details, other exemplary embodiments, features, and advantages will be clarified from the following drawings, claims, and detailed description.

These general and specific exemplary embodiments may be implemented by a system, a method, a computer program, or a combination of the system, the method, and the computer program.

BRIEF DESCRIPTION OF THE DRAWINGS

The above and other exemplary embodiments, features, and advantages of the invention will be more apparent from the following description taken in conjunction with the accompanying drawings, in which.

DETAILED DESCRIPTION

Figure 1:
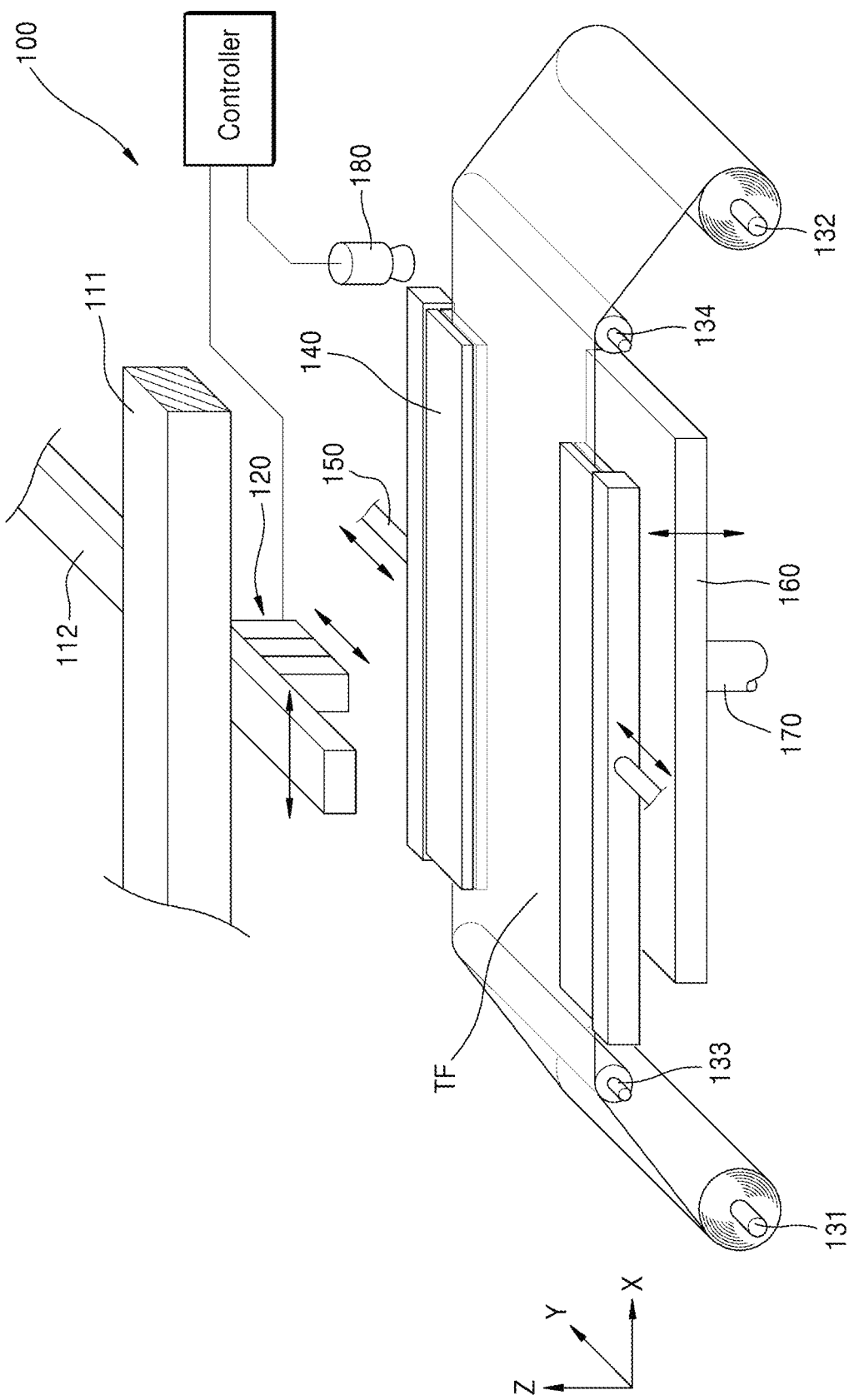
FIG. 1 is a perspective view of an exemplary embodiment of an apparatus for manufacturing a display device.

Reference will now be made in detail to embodiments, examples of which are illustrated in the accompanying drawings, where like reference numerals refer to like elements throughout. In this regard, the exemplary embodiments may have different forms and should not be construed as being limited to the descriptions set forth herein. Accordingly, the illustrated exemplary embodiments are merely described below, by referring to the drawing figures, to explain exemplary embodiments of the description. As used herein, the term "and/or" includes any and all combinations of one or more of the associated listed items. Expressions such as "at least one of," when preceding a list of elements, modify the entire list of elements and do not modify the individual elements of the list.

Since the disclosure may have various modifications and several embodiments, embodiments are shown in the drawings and will be described in detail. Effects, features, and a method of achieving the same will be specified with reference to the exemplary embodiments described below in detail together with the attached drawings. However, the exemplary embodiments may have different forms and the invention should not be construed as being limited to the descriptions set forth herein.

The exemplary embodiments will be described below in more detail with reference to the accompanying drawings. Those components that are the same or are in correspondence are rendered the same reference numeral regardless of the figure number, and repeated description thereof will be omitted.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context.

In the specification, it is to be understood that the terms such as "including" or "having" are intended to indicate the existence of the features or components disclosed in the specification, and are not intended to preclude the possibility that one or more other features or components may be added.

It will be understood that when a layer, region, or component is referred to as being "disposed on" another layer, region, or component, it may be directly or indirectly disposed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the invention is not limited thereto.

In the exemplary embodiments below, an x-axis, a y-axis, and a z-axis are not limited to three axes on a rectangular coordinates system but may be construed as including these axes. For example, an x-axis, a y-axis, and a z-axis may be at right angles or may also indicate different directions from one another, which are not at right angles.

When a certain exemplary embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

Figure 2:
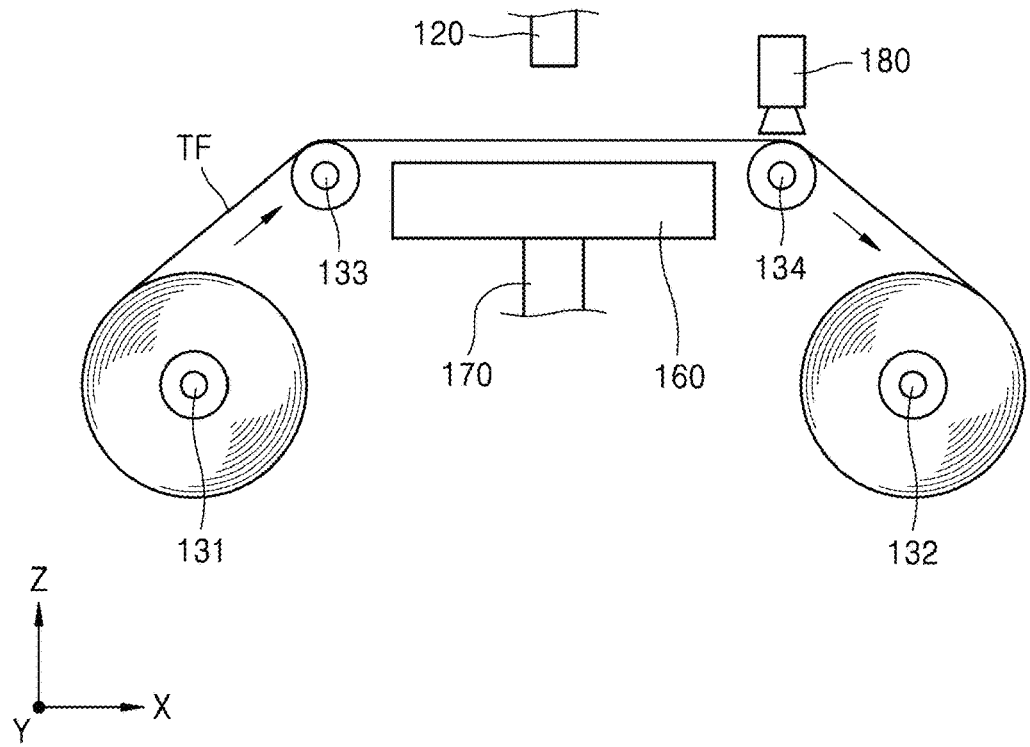
FIGS. 2 and 3 are side views illustrating an operation of the apparatus for manufacturing a display device, illustrated in FIG. 1.
Figure 3:
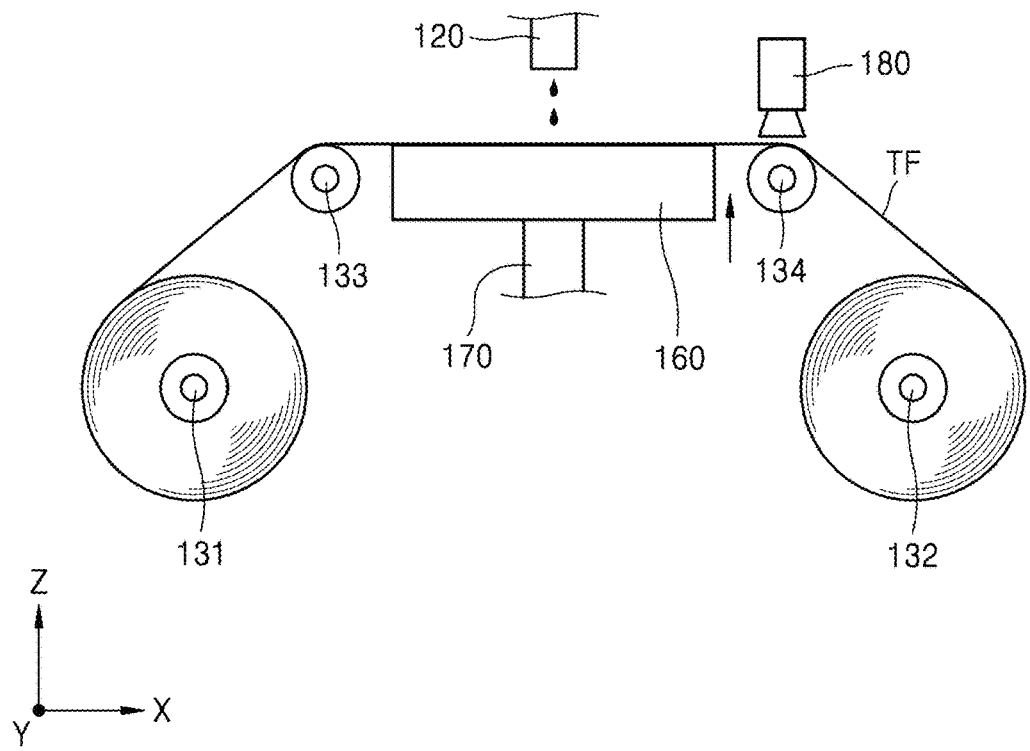

FIG. 1 is a perspective view of an exemplary embodiment of an apparatus 100 for manufacturing a display device. FIGS. 2 and 3 are side views illustrating an operation of the apparatus 100 for manufacturing a display device, illustrated in FIG. 1.

Referring to FIGS. 1 through 3, the apparatus 100 for manufacturing a display device may include a first roller 131, a second roller 132, a third roller 133, a fourth roller 134, a flatness maintainer (not shown), and a sensing unit 180.

One of the first roller 131 and the second roller 132 may wind a film member TF and then unwind the same. Also, the other of the first roller 131 and the second roller 132 may wind the unwound film member TF. In this case, the film member TF may be a transparent material. In an exemplary embodiment, the film member TF may include a synthetic resin, for example.

At least one of the first roller 131 and the second roller 132 described above may include a roller driver (not shown) driving at least one of the first roller 131 and the second roller 132. The roller driver may include a decelerator connected to at least one of the first roller 131 and the second roller 132 and a motor connected to the decelerator. In another exemplary embodiment, the roller driver may also include a motor connected to at least one of the first roller 131 and the second roller 132.

The third roller 133 and the fourth roller 134 may bend the film member TF. Here, the third roller 133 and the fourth roller 134 may prevent a decrease in tension of the film member TF. In an exemplary embodiment, the third roller 133 may be arranged above the first roller 131 to bend the film member TF wound from the first roller 131, for example. Also, the fourth roller 134 may be arranged above the second roller 132 to bend the film member TF being wound around the second roller 132. In this case, a rotational center of the third roller 133 and a rotational center of the fourth roller 134 may be arranged on a straight line, and a portion of the third roller 133 contacting the film member TF and a portion of the fourth roller 134 contacting the film member TF may be arranged on a same plane.

The flatness maintainer may flatten the film member TF arranged between the first roller 131 and the second roller 132. The flatness maintainer may be provided in various forms. In an exemplary embodiment, the flatness maintainer may include a clamping unit 140 that pulls sides of the film member TF, for example. The flatness maintainer may include a support chuck 160 that is arranged below the film member TF and adsorbs or supports the film member TF.

The clamping unit 140 as described above may apply a force to the film member TF in a direction (for example, a Y-direction in FIG. 1) perpendicular to a movement direction of the film member TF (for example, an X-direction in FIG. 1). In this case, the clamping unit 140 may maintain an upper surface of the film member TF flat by pulling the sides of the film member TF. The clamping unit 140 may include grip portions respectively contacting the upper surface and the lower surface of the film member TF. The grip portions may be arranged to face each other to adjust a distance between the grip portions.

The clamping unit 140 may be connected to a clamp driver 150. The clamp driver 150 may vary a position of the clamping unit 140. In an exemplary embodiment, the clamp driver 150 may include a cylinder connected to the clamping unit 140, for example. In another exemplary embodiment, the clamp driver 150 may include a linear motor connected to the clamping unit 140. In another exemplary embodiment, the clamp driver 150 may include a ball screw connected to the clamping unit 140 and a motor connected to the ball screw. The clamp driver 150 is not limited to the above, and may include any device and structure that is connected to the clamping unit 140 and moves the clamping unit 140 in a direction perpendicular to a transport direction of the film member TF.

The support chuck 160 may be arranged below the film member TF and move. The support chuck 160 may move up and down to selectively contact the film member TF. The support chuck 160 may be connected to a support chuck driver 170. The support chuck driver 170 is similar to the clamp driver 150 described above, and thus, detailed description thereof will be omitted.

The support chuck 160 may simply contact the lower surface of the film member TF to support the film member TF or completely adhere to the lower surface of the film member TF to fix the lower surface of the film member TF. In an exemplary embodiment, the support chuck 160 may have a plate shape having a flat upper surface. In another exemplary embodiment, the support chuck 160 may include a vacuum form in which a suction hole (not shown) defined in an outer surface thereof and a flow passage (not shown) communicating with the suction hole is arranged therein, and the flow passage is connected to an external suction pump (not shown) or the like to discharge a gas inside the flow passage to the outside to adsorb the film member TF through the suction hole. In another exemplary embodiment, the support chuck 160 may also include a porous chuck, on an outer surface of which a plurality of grooves or holes are defined. Hereinafter, for convenience of description, the support chuck 160 in the form of a vacuum chuck will be described in detail.

The sensing unit 180 may detect droplets arranged on the film member TF. Here, the sensing unit 180 may be arranged to face the upper surface of the film member TF or the lower surface of the film member TF. In this case, the sensing unit 180 may include a camera capturing an image of the droplets on the film member TF. Hereinafter, for convenience of description, an exemplary embodiment in which the sensing unit 180 is arranged to face the upper surface of the film member TF will be described in detail.

In regard to a method of operating the apparatus 100 for manufacturing a display device, as described above, a head unit 120 may be connected to a first linear driver 111 and a second linear driver 112. The second linear driver 112 may be connected to the first linear driver 111 and linearly move in a first direction (for example, X-direction in FIG. 1), and the second linear driver 112 may move the head unit 120 in a second direction different from the first direction (for example, the Y-direction in FIG. 1). In this case, the first linear driver 111 and the second linear driver 112 may each include a linear motor.

The first linear driver 111 and the second linear driver 112 as described above may move the head unit 120 to a process region and a test region. The process region may refer to a region for manufacturing a display device (not shown) described below, and the test region may refer to a region where the film member TF is arranged.

First, when the head unit 120 enters the test region, a roller driver (not shown) may operate to drive at least one of the first roller 131 and the second roller 132. In this case, the film member TF wound around the first roller 131 may be unwound to be moved to the second roller 132. Next, the operation of the roller driver may be stopped and the film member TF may be arranged between the first roller 131 and the second roller 132.

When the film member TF is stopped as described above, the clamp driver 150 operates to move the clamping unit 140 to a side of the film member TF and the clamping unit 140 may grip the side of the film member TF.

After the clamping unit 140 has gripped the side of the film member TF as above, the clamp driver 150 operates to take the clamping unit 140 apart from a center of the film member TF. In this case, a distance between a pair of clamping units 140 arranged to face each other may increase gradually.

When the clamping unit 140 moves as described above, the film member TF may be flattened. In detail, when only the first roller 131 and the second roller 132 are included, the film member TF may be wrinkled due to an external environment or assembly tolerance during its movement. When droplets are dropped on the film member TF in this case from the head unit 120, as the film member TF has an uneven surface, it may be difficult to test a pattern accurately. However, by pulling the side of the film member TF by the clamping unit 140, the upper surface of the film member TF may be kept flat.

Before, while, or after pulling the side of the film member TF by the clamping unit 140, the support chuck 160 may be raised to support the lower surface of the film member TF. In this case, the support chuck driver 170 may operate to raise the support chuck 160 to contact the lower surface of the film member TF. Also, as described above, the film member TF may be completely adhered via the suction hole defined in the lower surface of the support chuck 160, and moreover, the film member TF may be fixed and also kept flat to some extent. In this case, fixing the film member TF via the suction hole may be performed after pulling the film member TF by the clamping unit 140.

When the film member TF is flattened as described above, the head unit 120 may be moved to discharge droplets on the film member TF. Here, a material for forming droplets may be various ones as an organic material or an inorganic material.

After the droplets have dropped on the film member TF, the sensing unit 180 may detect the droplets on the film member TF. Here, the sensing unit 180 may sense the droplets while being in a fixed state. In an alternative exemplary embodiment, the sensing unit 180 may detect droplets on the film member TF after a position of the sensing unit 180 is varied to arrange the sensing unit 180 to face the droplets on the film member TF.

The sensing unit 180 may capture an image of the droplets, and particularly, detect at least one of a size, a shape, a volume, and a position of the droplets. Here, an additional controller ("Controller in FIG. 1) may calculate or determine at least one of the size, the shape, the volume, and the position of the droplets based on the image of the droplets captured using the sensing unit 180.

The controller may control size, shape, volume, or and position of the droplets discharged from the head unit 120 by comparing one of the detected size, shape, volume, or and position of the droplets with one of a preset size, shape, volume, or and position of the droplets based on a result of sensing by the sensing unit 180.

After controlling the droplets as described above, a position of the head unit 120 may be varied or the film member TF may be moved again, and then the head unit 120 may discharge droplets on the film member TF and the above-described operation may be repeated. Here, when the film member TF is moved, the clamping unit 140 may not be gripping the film member TF.

When droplets discharged from the head unit 120 and disposed (e.g., mounted) on the film member TF in the above-described operation are determined to be identical to preset droplets or to be within an error range, the head unit 120 may be moved to the process region to perform a process.

Thus, according to the apparatus 100 for manufacturing a display device and a method of manufacturing a display device, droplets of the head unit 120 may be accurately measured to control the head unit 120. In addition, according to the apparatus 100 for manufacturing a display device and the method of manufacturing a display device, as the upper surface of the film member TF is kept flat, distortion of at least one of the size, the shape, the volume, and the position of droplets due to the shape of the film member TF may be prevented.

Figure 4:
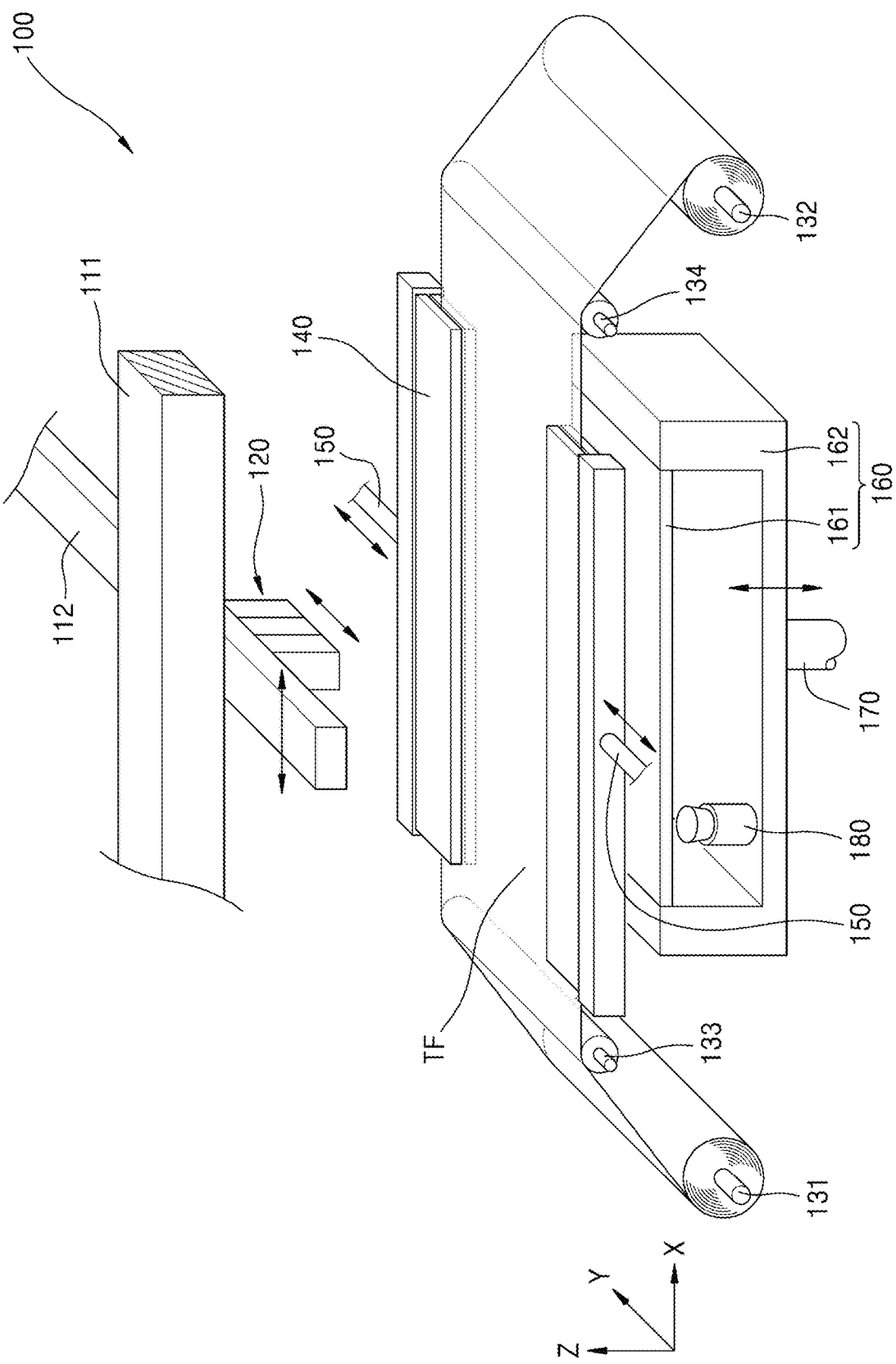
FIG. 4 is a perspective view of an exemplary embodiment of an apparatus for manufacturing a display device.
Figure 5:
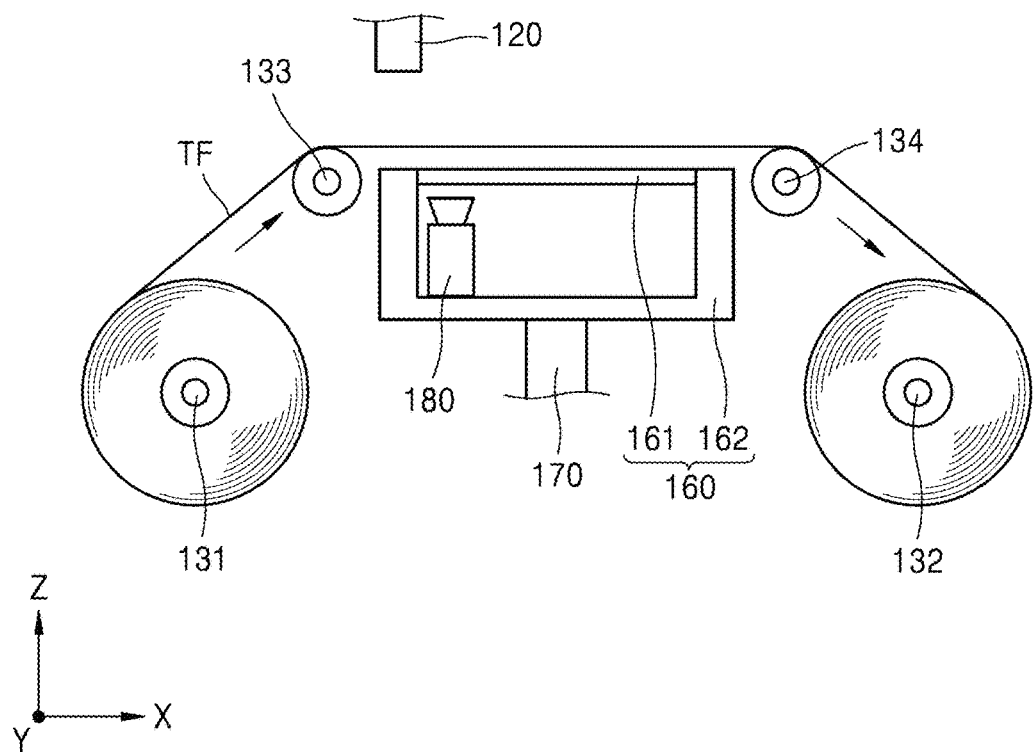
FIGS. 5 and 6 are side views illustrating an operation of the apparatus for manufacturing a display device, illustrated in FIG. 4.
Figure 6:
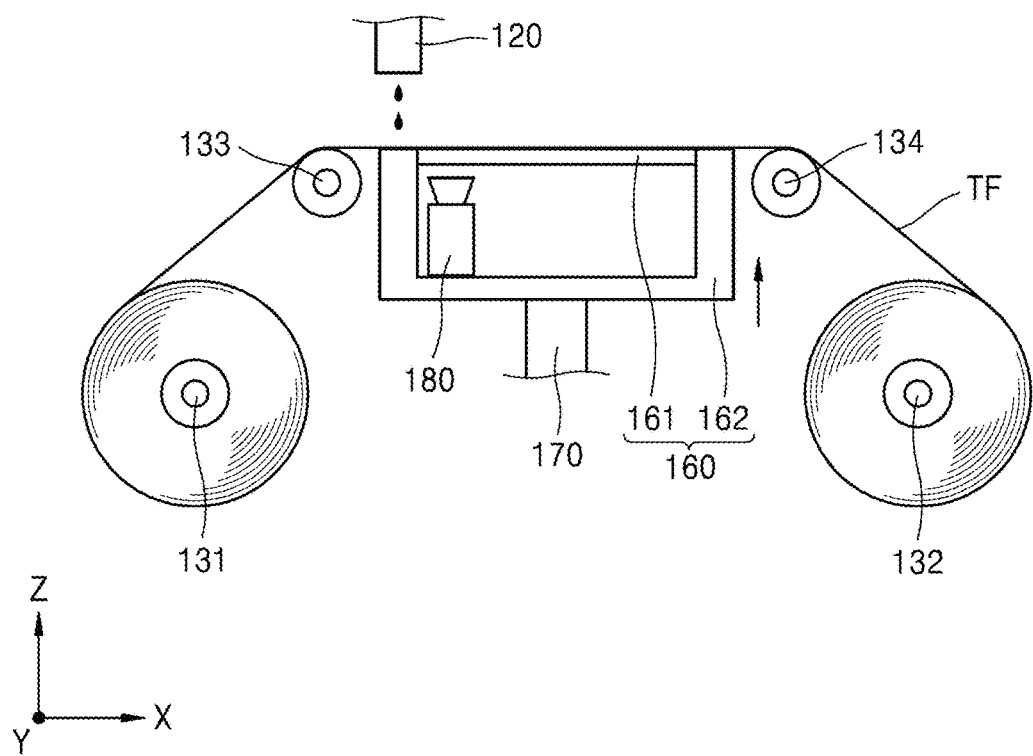

FIG. 4 is a perspective view of an exemplary embodiment of an apparatus for manufacturing a display device. FIGS. 5 and 6 are side views illustrating an operation of the apparatus for manufacturing a display device, illustrated in FIG. 4.

Referring to FIGS. 4 through 6, the apparatus 100 for manufacturing a display device may include a first roller 131, a second roller 132, a third roller 133, a fourth roller 134, a flatness maintainer (not shown), and a sensing unit 180. Here, the first roller 131, the second roller 132, the third roller 133, and the fourth roller 134 are respectively identical to those described with reference to FIGS. 1 through 3, and thus detailed description thereof will be omitted.

The flatness maintainer may include a clamping unit 140 and a support chuck 160. The clamping unit 140 is identical to that described with reference to FIGS. 1 through 3, and thus detailed description thereof will be omitted.

The support chuck 160 may include a support bracket 162 connected to the support chuck driver 170 and a transmitting portion 161 connected to the support bracket 162. A portion of the support bracket 162 may be open. The transmitting portion 161 may be arranged in the open portion of the support bracket 162 to be coupled to the support bracket 162. The transmitting portion 161 may include a transparent material. In an exemplary embodiment, the transmitting portion 161 may include a transparent synthetic resin such as acryl, glass, or the like, for example.

The sensing unit 180 may be arranged inside the support chuck 160. The sensing unit 180 may be fixed in the support bracket 162 or linearly move in one direction. The sensing unit 180 may detect droplets arranged on the film member TF via the transmitting portion 161. In this case, the sensing unit 180 may be provided in an identical or similar form as that described above with reference to FIGS. 1 through 3.

An operation of the apparatus 100 for manufacturing a display device, as described above, may be similar to that described above with reference to FIGS. 1 through 3. In detail, a roller driver (not shown) may operate to rotate at least one of the first roller 131 and the second roller 132, and the film member TF may be moved accordingly.

Next, the operation of the roller driver may be stopped, and the clamping unit 140 may grip a side of the film member TF to pull the film member TF according to an operation of a clamp driver 150. Also, the support chuck driver 170 may operate to bring the support chuck 160 into contact with a lower surface of the film member TF. In this case, as described above, the support chuck 160 may contact the film member TF to support the film member TF or may not only contact the film member TF but also fix the film member TF via vacuum or the like.

Next, the head unit 120 may discharge droplets to the film member TF, and the sensing unit 180 may detect the droplets on the film member TF. A controller ("Controller" in FIG. 1) may determine at least one of a size, volume, position, and shape of the droplets based on a result of the detecting and then control size, shape, volume, or and position of the droplets discharged from the head unit 120.

When the droplets discharged from the head unit 120 are determined to be identical or similar to preset droplets, the controller may arrange the head unit 120 in a process region to perform a process. The first linear driver 111 and the second linear driver 112 may arrange the head unit 120 at various positions according to a process.

In the process region, various layers may be provided using the head unit 120. In an exemplary embodiment, an organic layer or an inorganic layer may be disposed on a substrate (not shown) by the head unit 120 in the process region, for example.

Thus, according to the apparatus 100 for manufacturing a display device and a method of manufacturing a display device, droplets of the head unit 120 may be accurately measured to control the head unit 120. In addition, according to the apparatus 100 for manufacturing a display device and the method of manufacturing a display device, as an upper surface of the film member TF is kept flat, distortion of at least one of the size, the shape, the volume, and the position of droplets due to the shape of the film member TF may be prevented.

Figure 7:
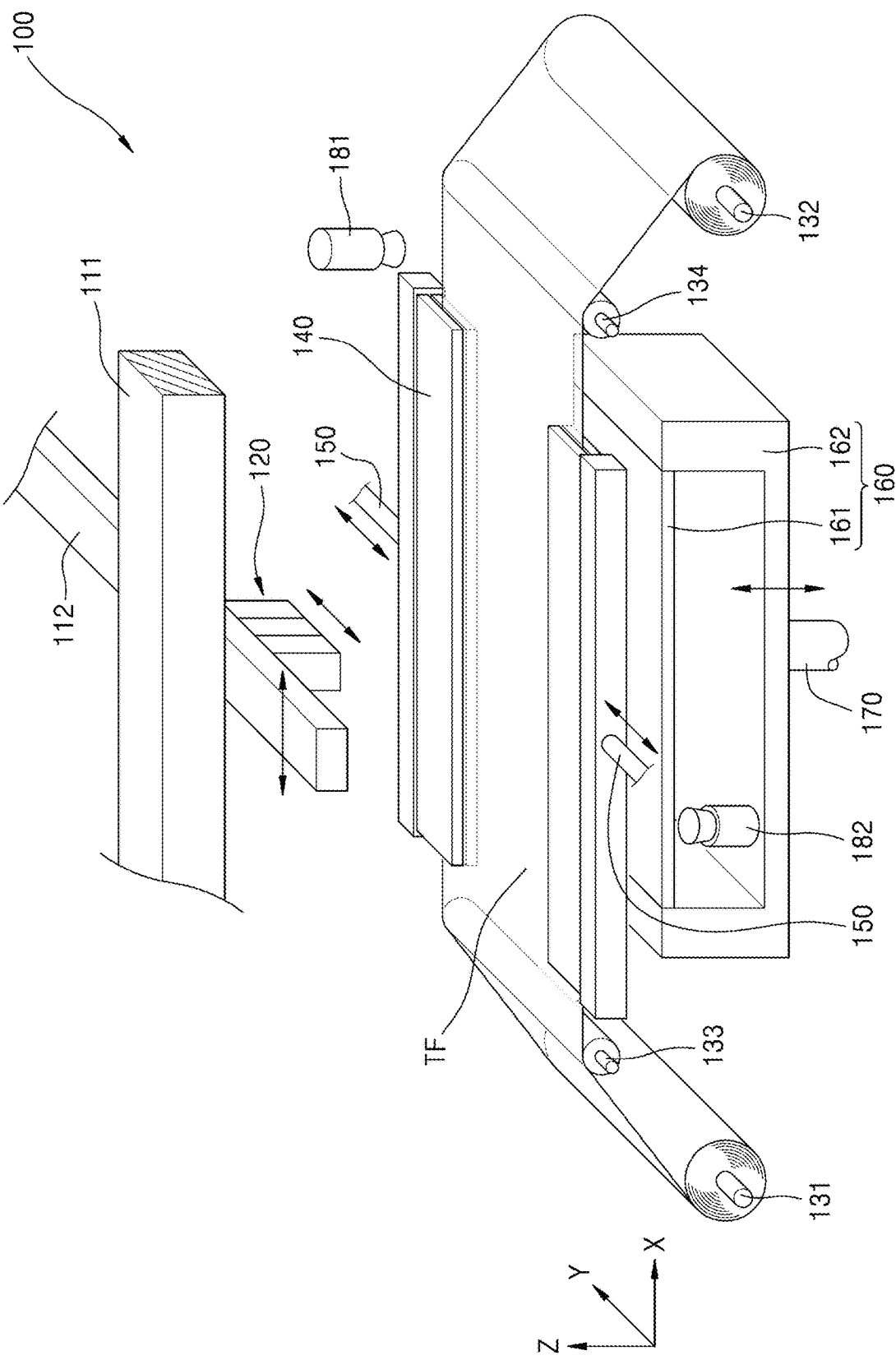
FIG. 7 is a perspective view of an exemplary embodiment of an apparatus for manufacturing a display device.
Figure 8:
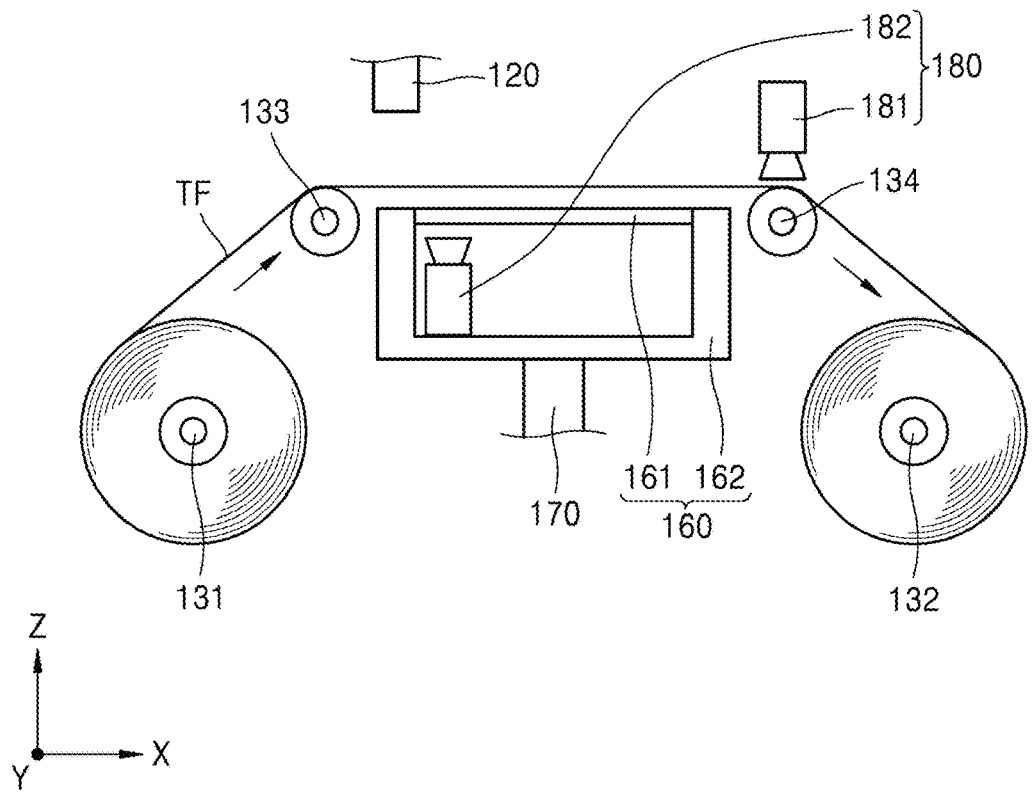
FIGS. 8 and 9 are side views illustrating an operation of the apparatus for manufacturing a display device, illustrated in FIG. 7.
Figure 9:
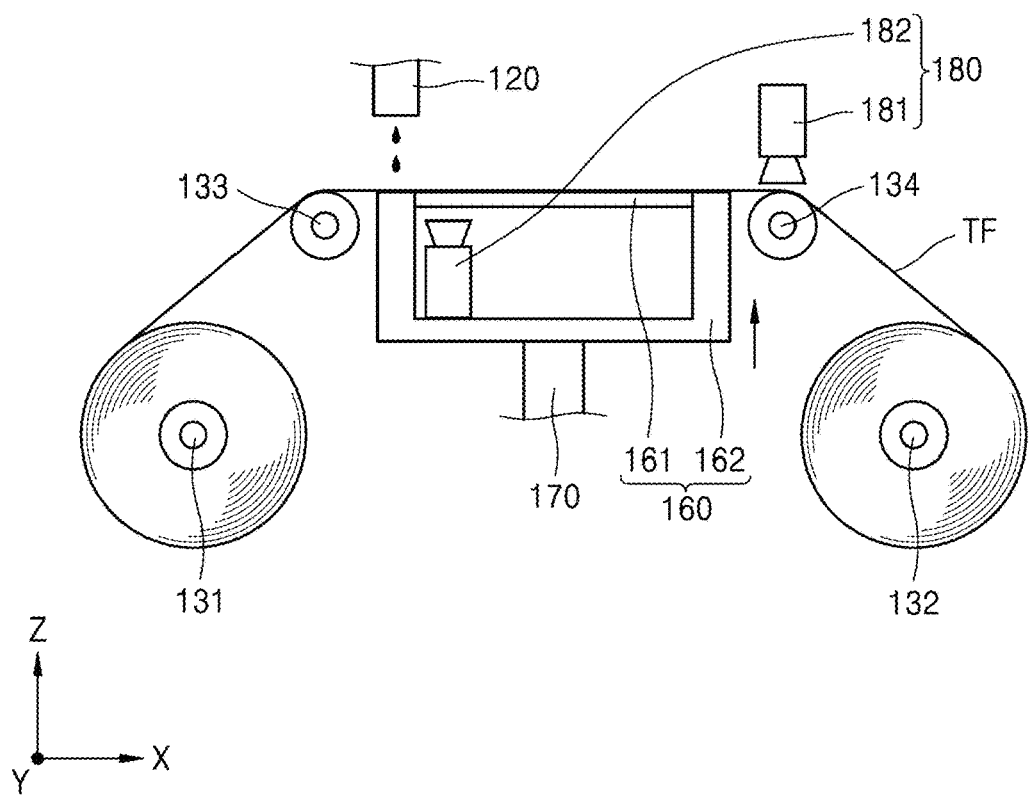

FIG. 7 is a perspective view of an exemplary embodiment of an apparatus for manufacturing a display device. FIGS. 8 and 9 are side views illustrating an operation of the apparatus for manufacturing a display device, illustrated in FIG. 7.

Referring to FIGS. 7 through 9, the apparatus 100 for manufacturing a display device may include a first roller 131, a second roller 132, a third roller 133, a fourth roller 134, a flatness maintainer (not shown), and a sensing unit 180. Here, the first roller 131, the second roller 132, the third roller 133, and the fourth roller 134 are respectively identical to those described with reference to FIGS. 1 through 3, and thus detailed description thereof will be omitted.

The flatness maintainer may include a clamping unit 140 and a support chuck 160. The clamping unit 140 and the support chuck 160 are identical or similar to those described with reference to FIGS. 4 through 6, and thus detailed description thereof will be omitted.

The sensing unit 180 may include a first sensing portion 181 arranged to face an upper surface of the film member TF and a second sensing portion 182 arranged to face a lower surface of the film member TF. The first sensing portion 181 may be arranged apart from the upper surface of the film member TF, and the second sensing portion 182 may be arranged to be apart from the lower surface of the film member TF. In this case, the first sensing portion 181 may be identical or similar to the sensing unit 180 described above with reference to FIGS. 1 through 3, and the second sensing portion 182 may be identical or similar to the sensing unit 180 described with reference to FIGS. 4 through 6.

In regard to an operation of the apparatus 100 for manufacturing a display device, as described above, a portion of the film member TF, on which droplets are to be discharged, may be arranged between the first roller 131 and the second roller 132 by a roller driver (not shown). Next, the operation of the roller driver is stopped and a clamp driver 150 is operated to grip a side of the film member TF by the clamping unit 140 and pull the side of the film member TF to be apart from a center of the film member TF.

The support chuck driver 170 may operate to bring the support chuck 160 into contact with the lower surface of the film member TF. Here, the support chuck 160 may support the film member TF or fix the film member TF while supporting the film member TF.

At least one of a first linear driver 111 and a second linear driver 112 may operate to arrange a head unit 120 on the film member TF, and droplets may be discharged to the film member TF by the head unit 120. Next, the droplets on the film member TF may be detected by the first sensing portion 181 and the second sensing portion 182. At least one of a position, shape, size, and volume of the droplets on the film member TF may be calculated based on an average of at least one of the position, shape, size, and volume of the detected droplets by the first sensing portion 181 and the second sensing portion 182.

Next, a controller ("Controller" in FIG. 1) may control droplets discharged from the head unit 120. In an exemplary embodiment, the controller ("Controller" in FIG. 1) may control a discharge rate, a discharge amount, a discharge volume, or the like of droplets discharged from the head unit 120, for example.

The above-described operation may be performed until at least one of the shape, size, position, and volume of droplets discharged from the head unit 120 is equal to at least one of a shape, size, position, and volume of preset droplets or corresponds to a set range.

When control of the head unit 120 is completed, the controller ("Controller" in FIG. 1) may move to a process region to form at least one of various layers on a substrate (not shown).

Thus, according to the apparatus 100 for manufacturing a display device and a method of manufacturing a display device, droplets of the head unit 120 may be accurately measured to control the head unit 120. In addition, according to the apparatus 100 for manufacturing a display device and the method of manufacturing a display device, as the upper surface of the film member TF is kept flat, distortion of at least one of the size, the shape, the volume, and the position of droplets due to the shape of the film member TF may be prevented.

Figure 10:
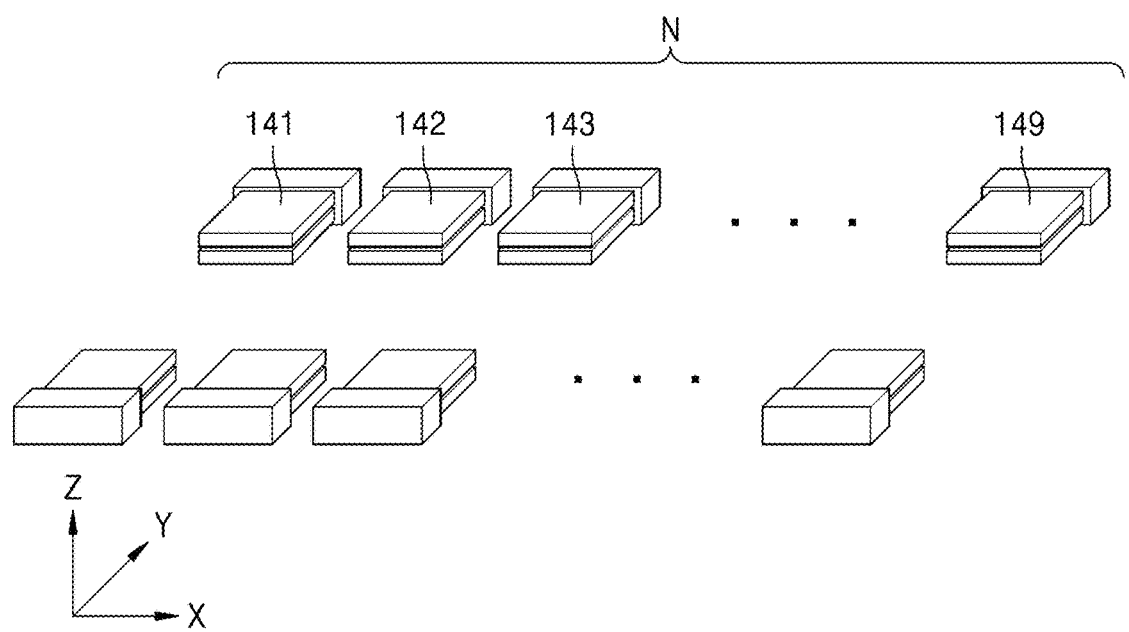
FIG. 10 is a perspective view of an exemplary embodiment of a clamping unit of an apparatus for manufacturing a display device.
Figure 11:
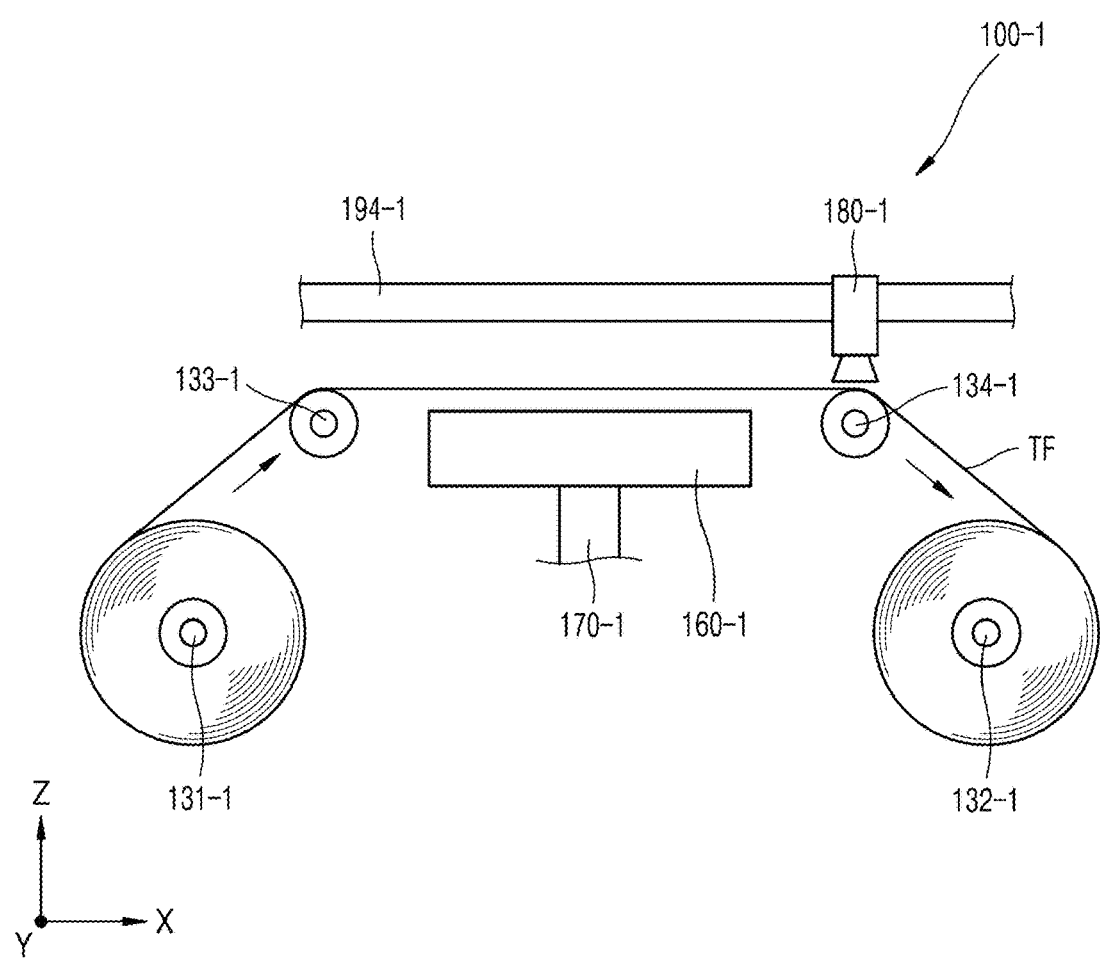
FIGS. 11 through 14 are side views illustrating another exemplary embodiment of an operation of an apparatus for manufacturing a display device.
Figure 12:
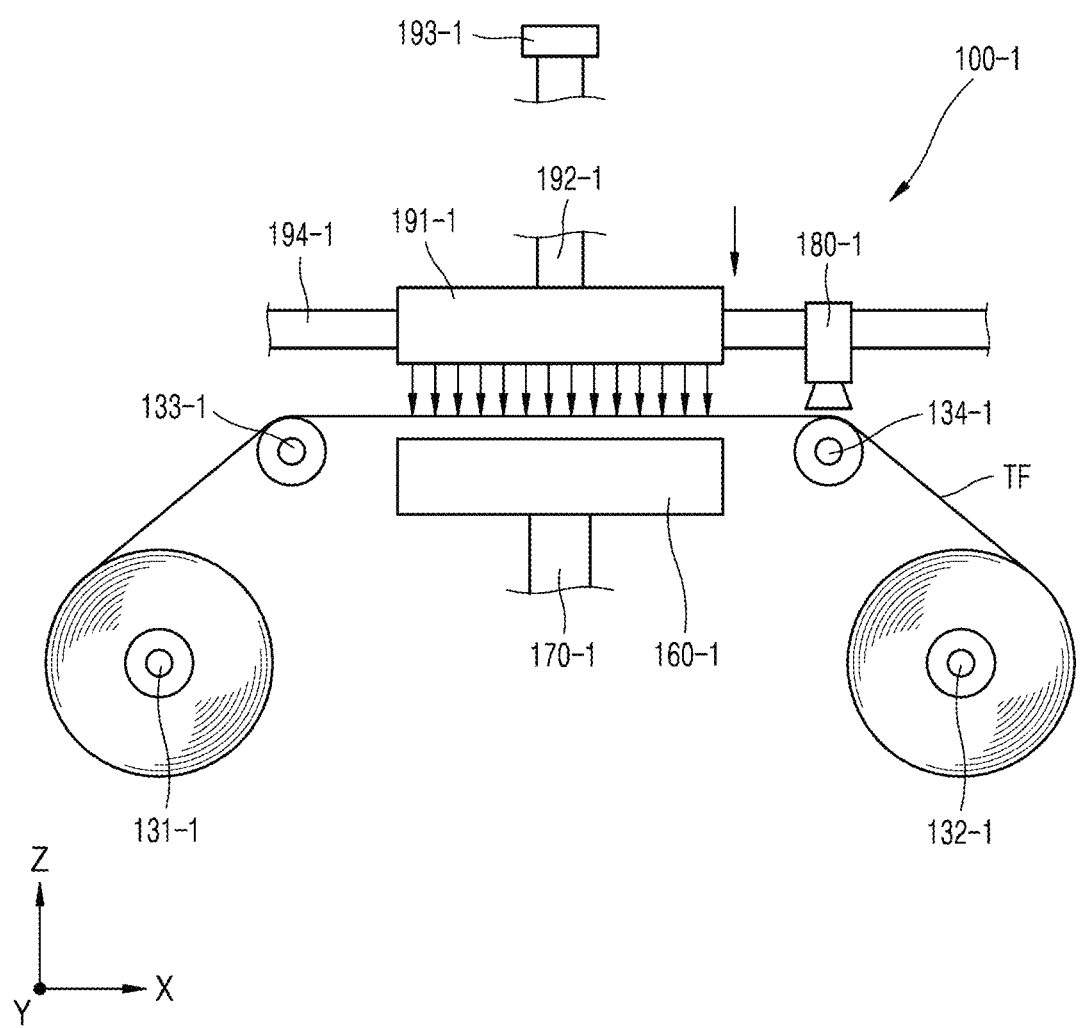
Figure 13:
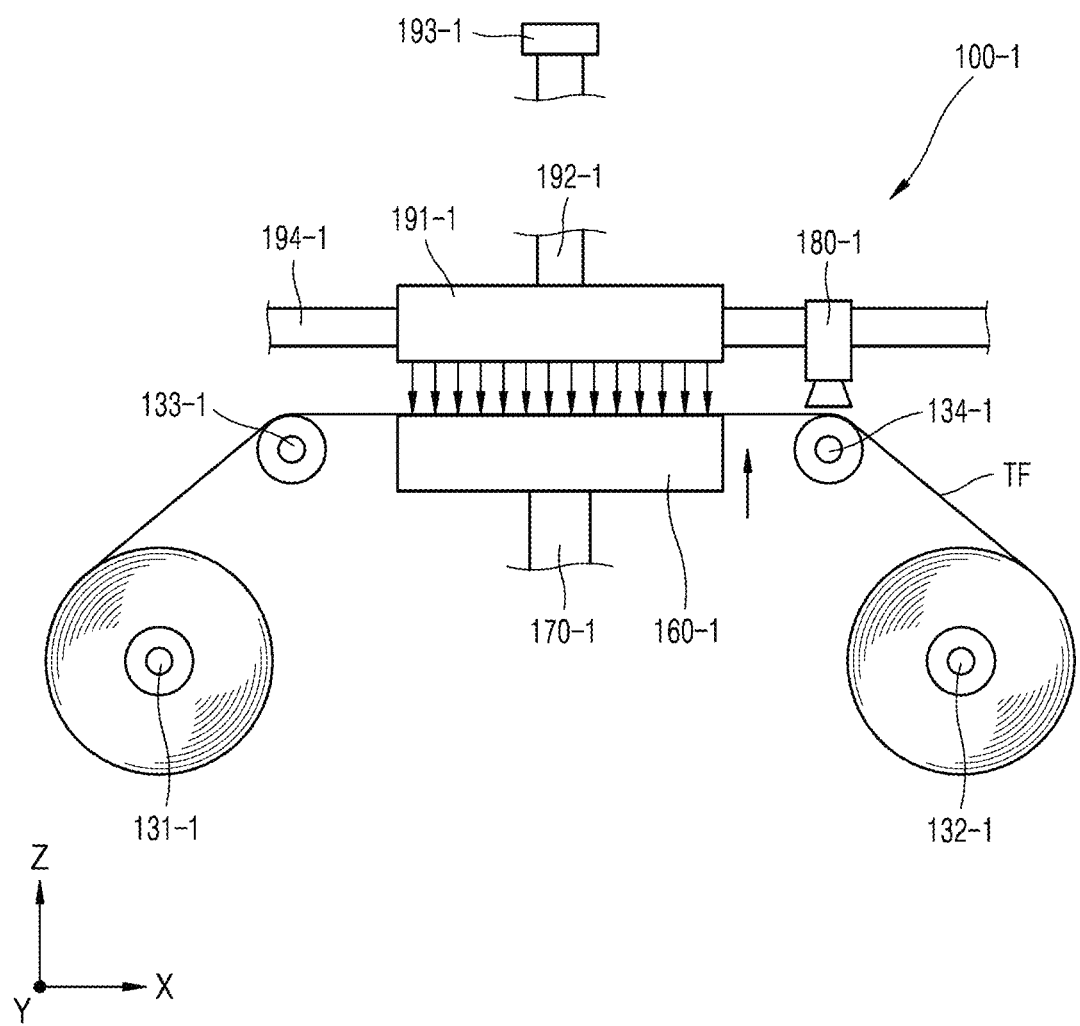
Figure 14:
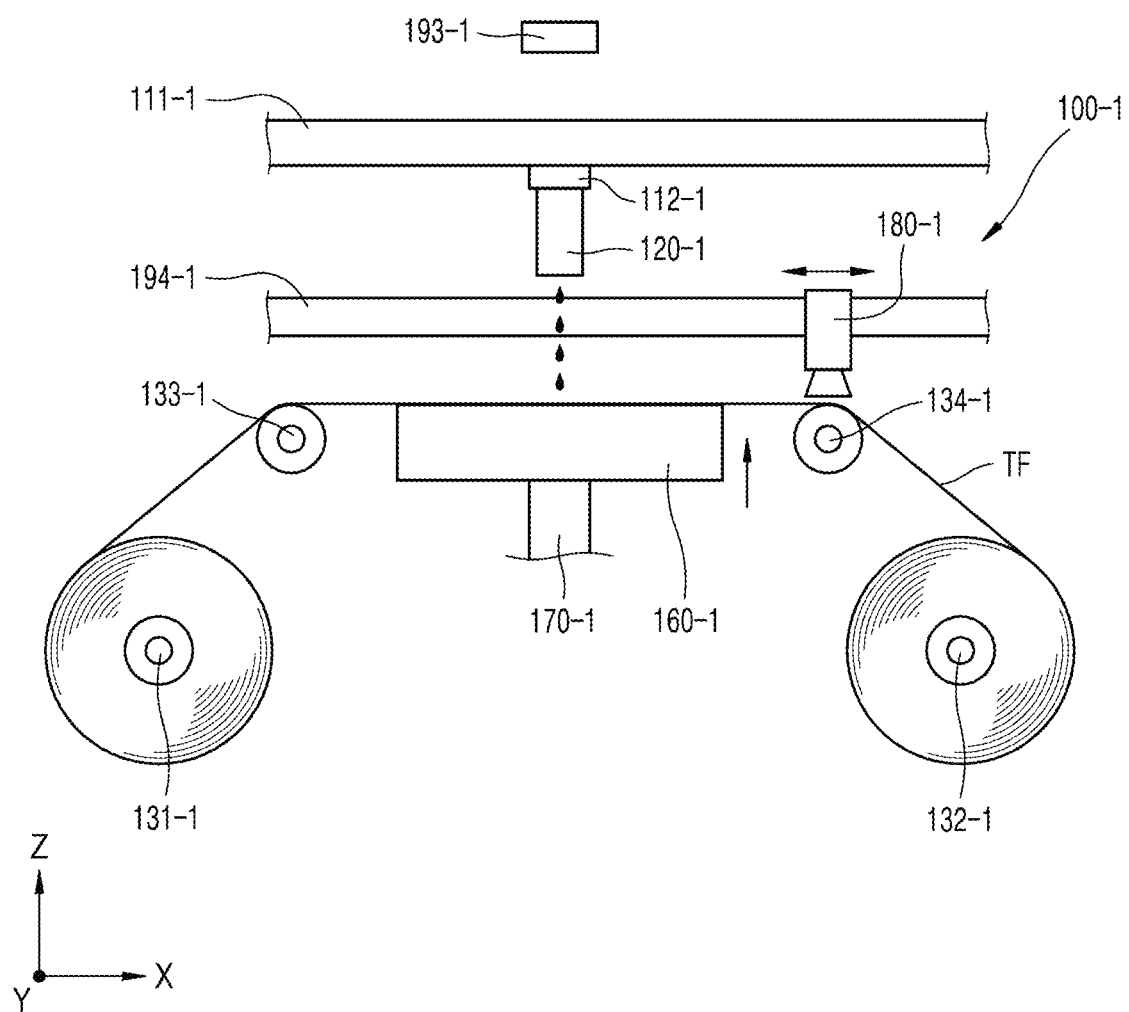
Figure 15:
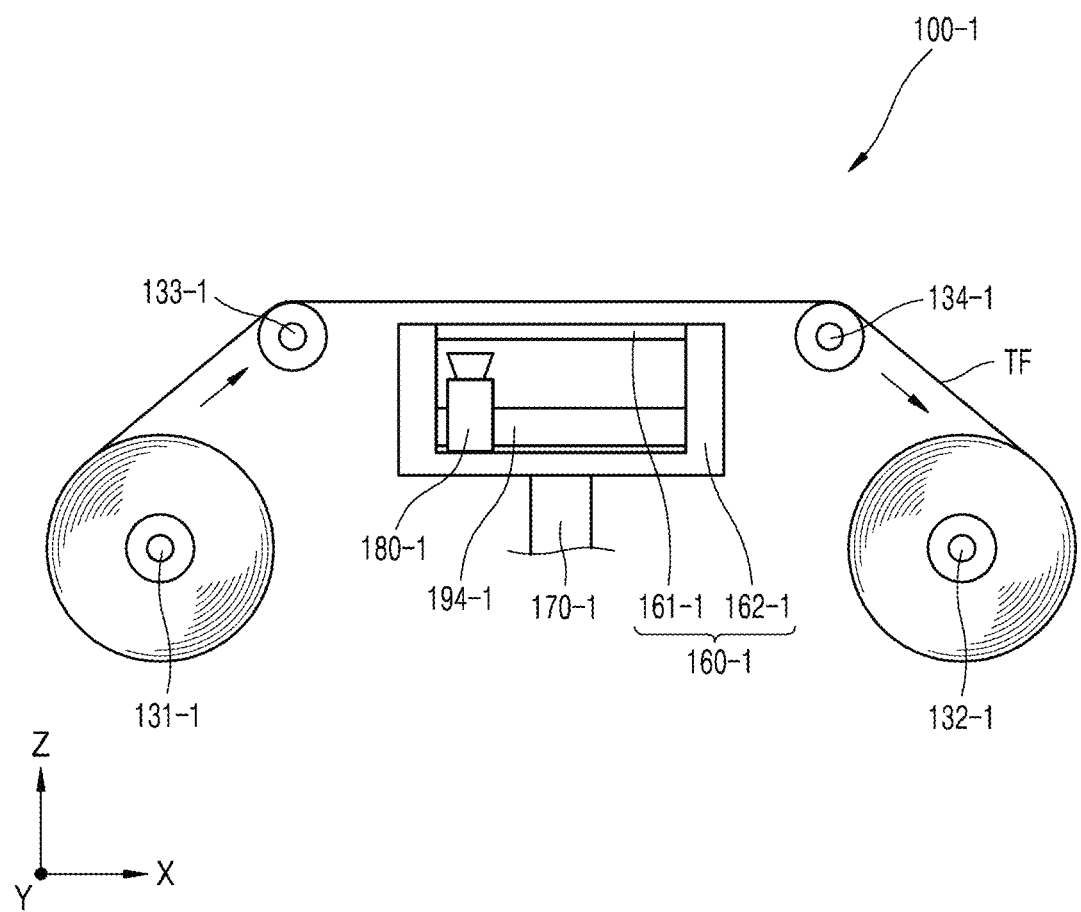
FIGS. 15 through 18 are side views illustrating another exemplary embodiment of an operation of an apparatus for manufacturing a display device.
Figure 16:
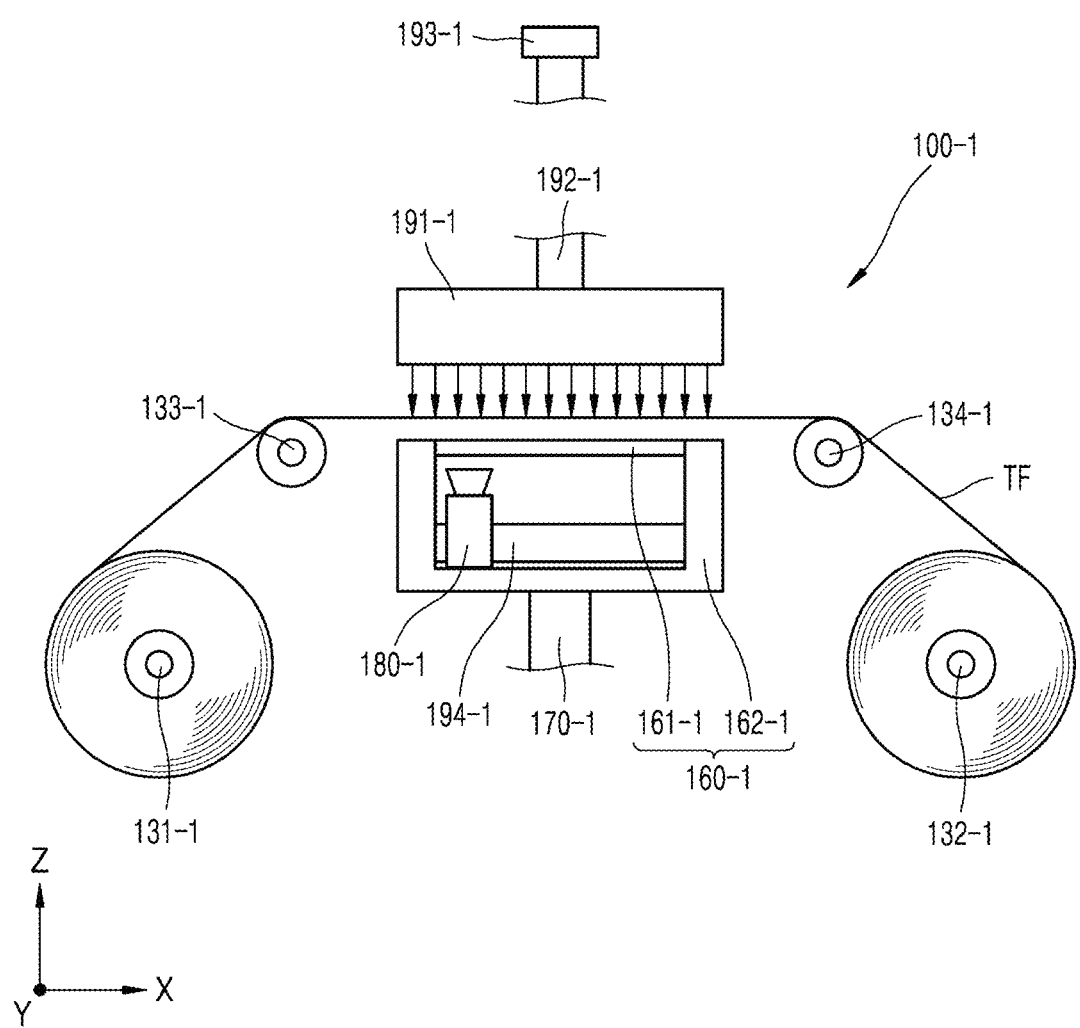
Figure 17:
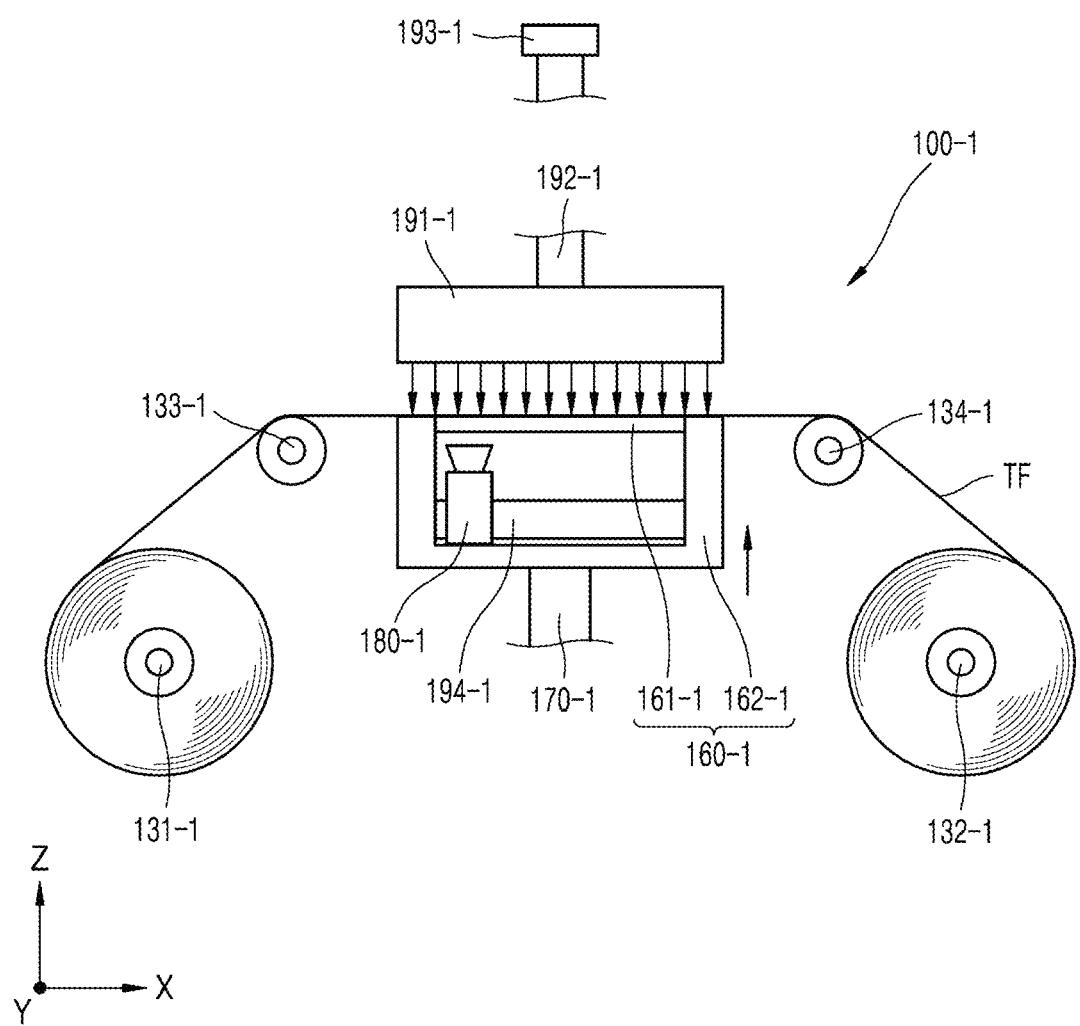
Figure 18:
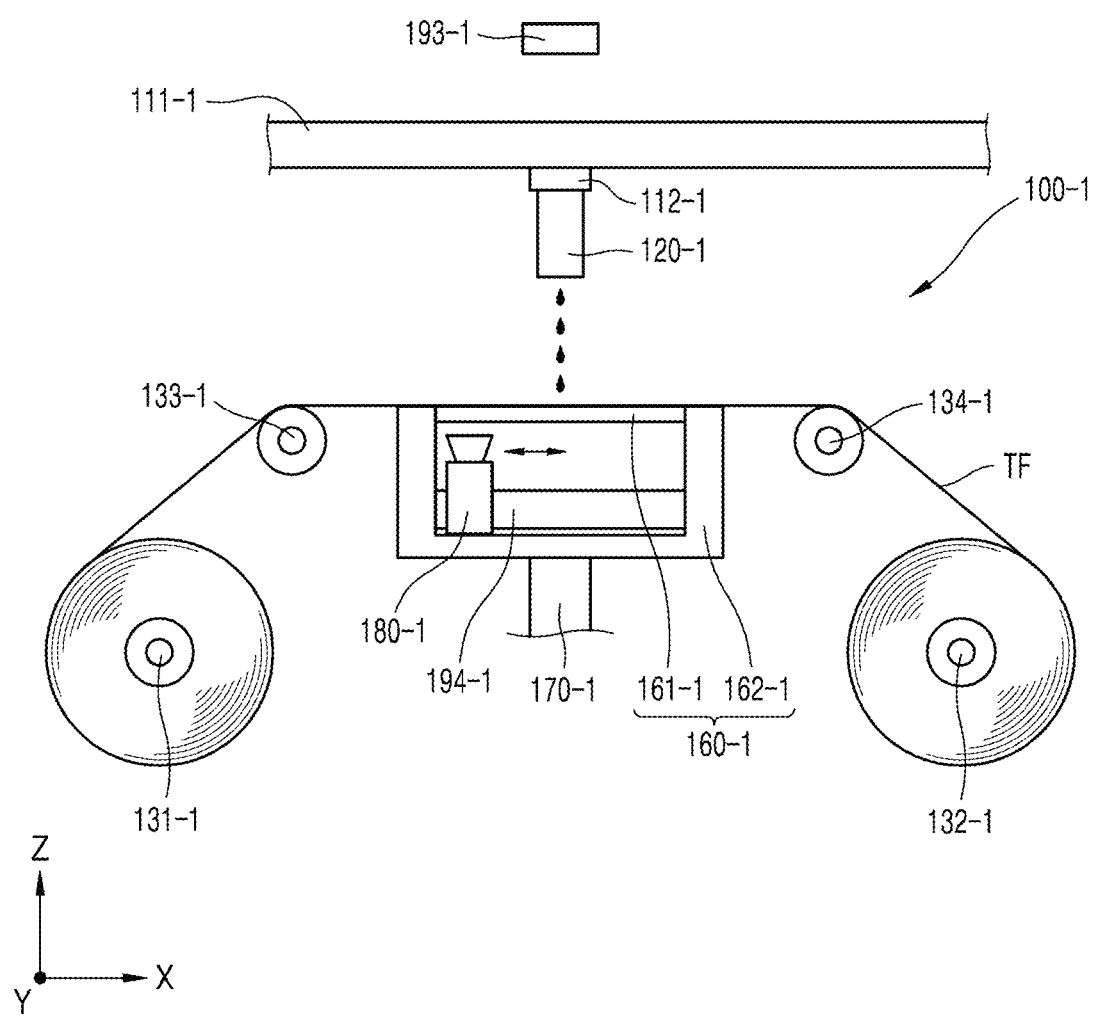
Figure 19:
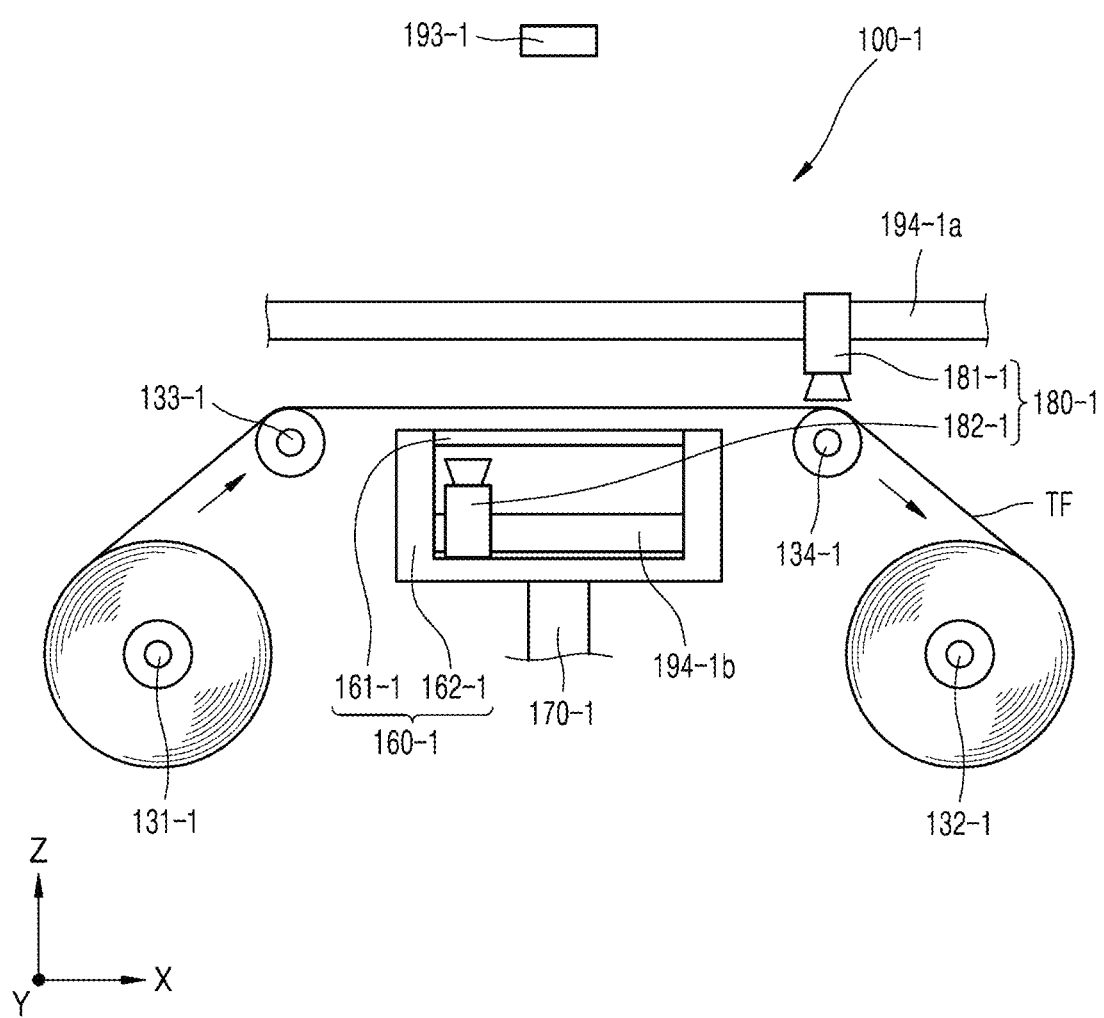
FIGS. 19 through 22 are side views illustrating another exemplary embodiment of an operation of an apparatus for manufacturing a display device.
Figure 20:
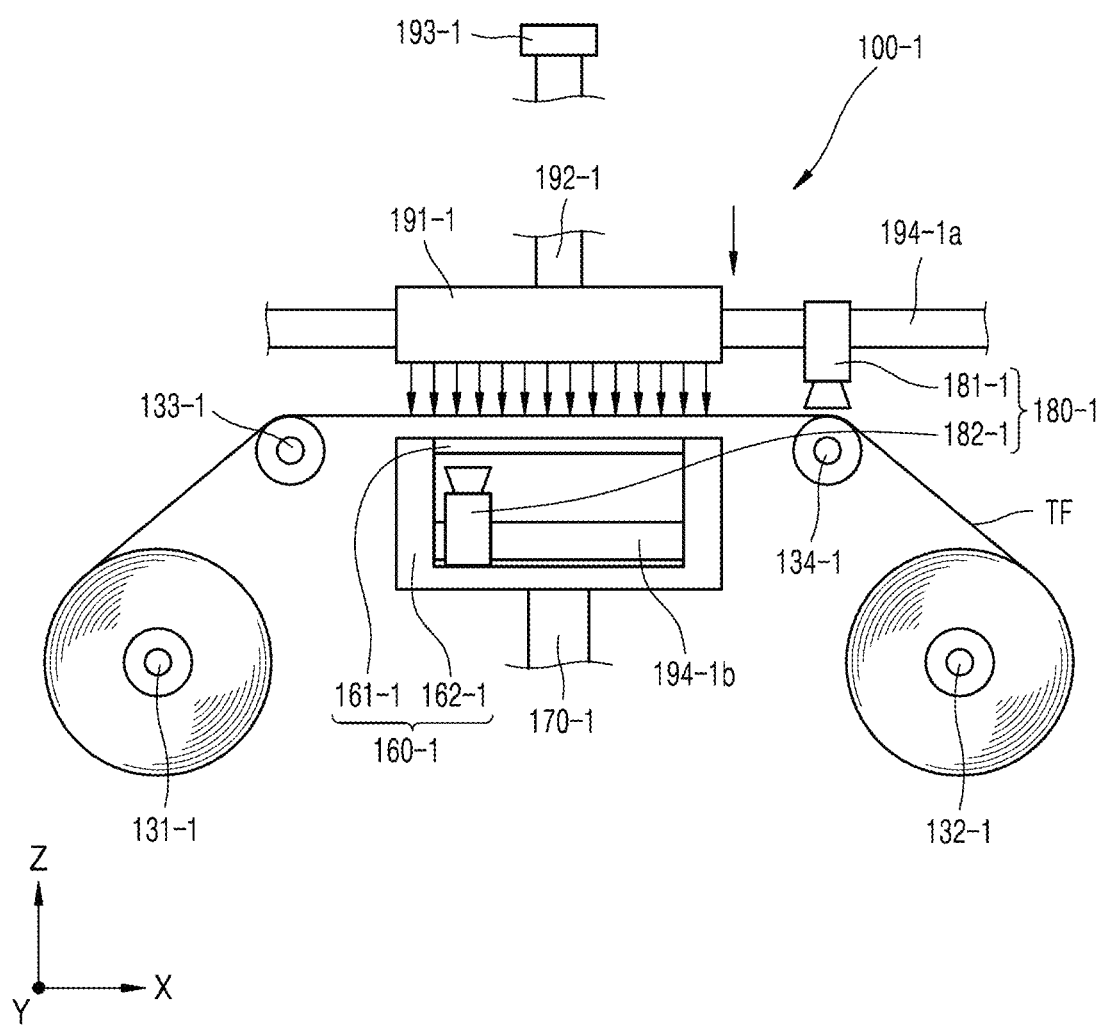
Figure 21:
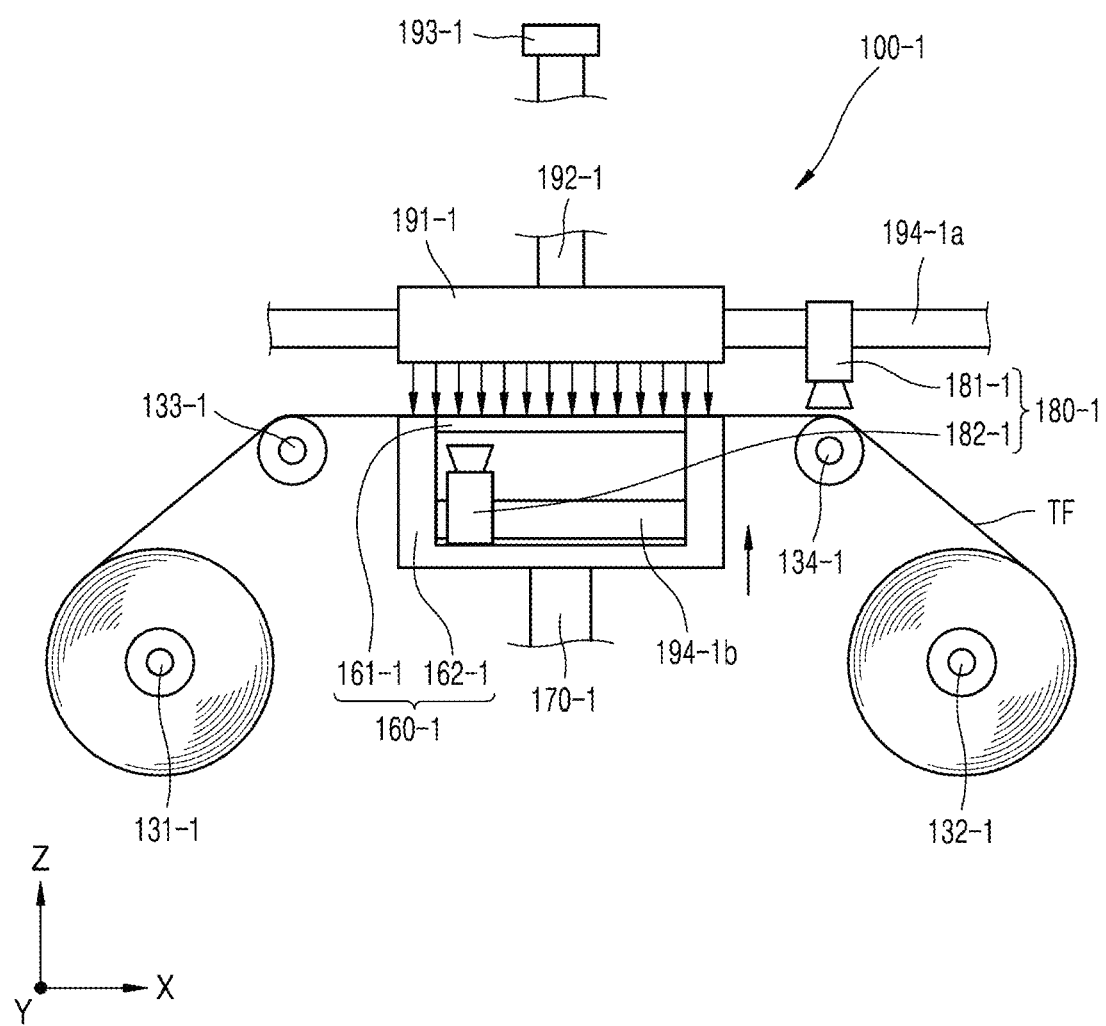
Figure 22:
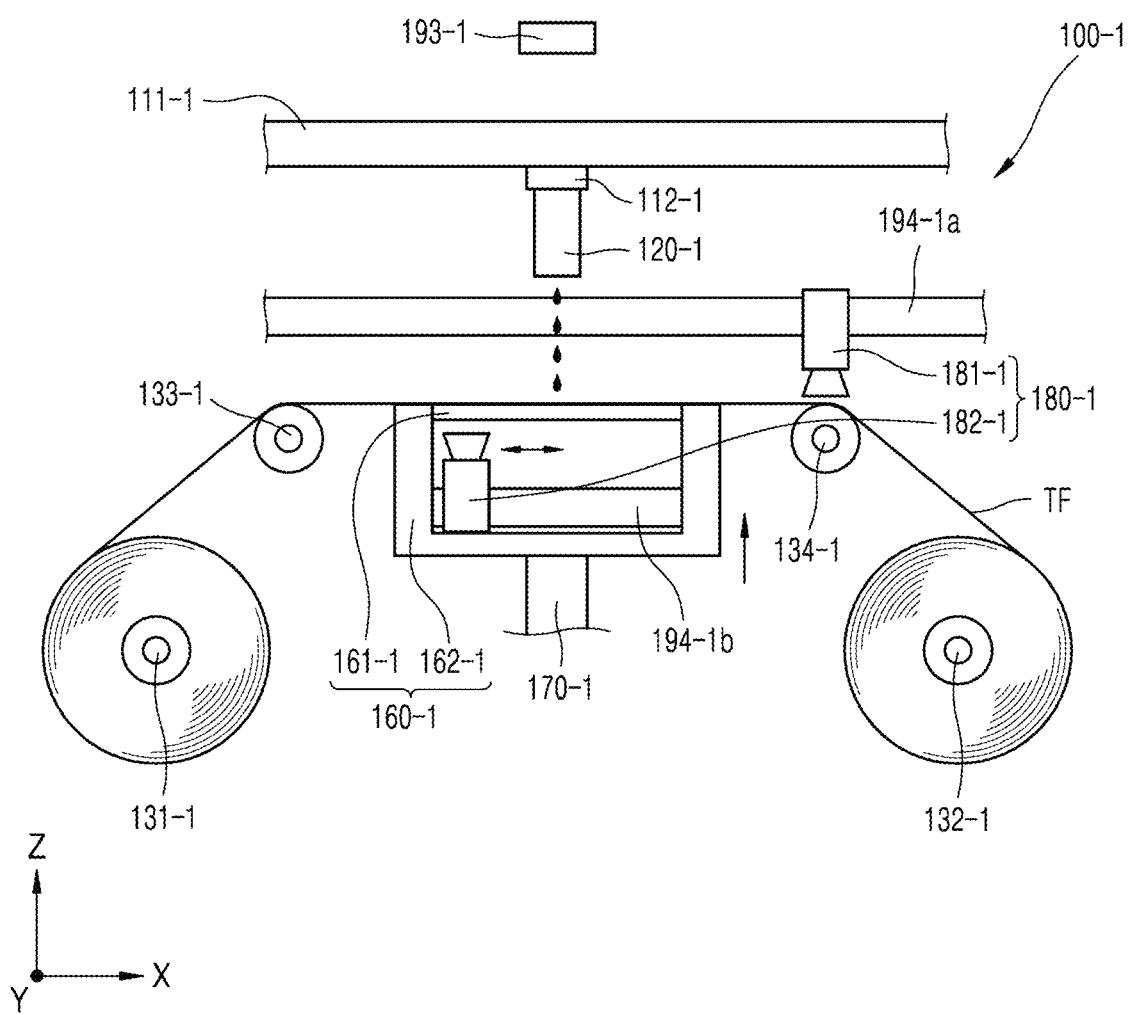

FIG. 10 is a perspective view of an exemplary embodiment of a clamping unit 140 of an apparatus 100 for manufacturing a display device.

Referring to FIG. 10, the apparatus 100 for manufacturing a display device may be identical or similar to that described above with reference to FIG. 1, 3, or 6. Here, a plurality of clamping units 140 may be included.

In an exemplary embodiment, N clamping units 140 (N is a natural number) may be included, for example. The plurality of clamping units 140 may include a first clamping unit 141, a second clamping unit 142, a third clamping unit 143, . . . , and an Nth clamping unit 149 (when N is nine, for example). In this case, the first through Nth clamping units 141 through 149 may be arranged to be spaced apart from each other in a transport direction of a film member (not shown). Also, a pair of clamping units 140 among the plurality of clamping units 140 may be respectively provided at two sides of the film member.

The plurality of clamping units 140 arranged at a side of the film member may be connected to one clamping driver (not shown) to simultaneously linearly move. In another exemplary embodiment, the plurality of clamping units 140 may be respectively connected to a plurality of clamping drivers (not shown) to be synchronized with each other and simultaneously linearly move accordingly.

FIGS. 11 through 14 are side views illustrating another exemplary embodiment of an operation of an apparatus 100-1 for a manufacturing display device.

Referring to FIGS. 11 through 14, the apparatus 100-1 for manufacturing a display device may include a first roller 131-1, a second roller 132-1, a third roller 133-1, a fourth roller 134-1, a flatness maintainer (not shown), and a sensing unit 180-1. Here, the first roller 131-1, the second roller 132-1, the third roller 133-1, the fourth roller 134-1, and the sensing unit 180-1 are respectively identical to those described with reference to FIGS. 1 through 3, and thus detailed description thereof will be omitted.

The flatness maintainer may include a gas ejecting unit 191-1 and a support chuck 160-1. Here, the support chuck 160-1 may be identical or similar to that described above with reference to FIGS. 1 through 3.

The gas ejecting unit 191-1 may be arranged to face an upper surface of a film member TF. The gas ejecting unit 191-1 may be arranged between the first roller 131-1 and the second roller 132-1 to eject inert gas to the film member TF.

In the gas ejecting unit 191-1, a flow passage connected to inert gas and an ejecting hole (not shown) which is connected to the flow passage and through which the inert gas is ejected to the outside may be arranged. In this case, the gas ejecting unit 191-1 may be connected to an inert gas supplier supplying external inert gas. In the above case, inert gas supplied from the inert gas supplier may be ejected from the gas ejecting unit 191-1 to the film member TF through the ejecting hole.

The gas ejecting unit 191-1 as described above may be connected to a third linear driver 192-1 and a fourth linear driver 193-1. The third linear driver 192-1 may move the gas ejecting unit 191-1 up and down. The third linear driver 192-1 is connected to the fourth linear driver 193-1, and the fourth linear driver 193-1 may linearly move the third linear driver 192-1.

The sensing unit 180-1 may include a sensing driver 194-1. The sensing driver 194-1 may linearly move the sensing unit 180-1. In an exemplary embodiment, the sensing driver 194-1 may be provided in various forms such as a linear motor, a ball screw and a motor, or the like.

In regard to an operation of the apparatus 100-1 for manufacturing a display device, as described above, a roller driver (not shown) may be operated to rotate at least one of the first roller 131-1 and the second roller 132-1. Next, when an operation of the roller driver is stopped, a portion of the film member TF may be arranged between the first roller 131-1 and the second roller 132-1.

Next, the third linear driver 192-1 and the fourth linear driver 193-1 may arrange the gas ejecting unit 191-1 on the upper surface of the film member TF. The gas ejecting unit 191-1 may eject inert gas onto the upper surface of the film member TF arranged between the first roller 131-1 and the second roller 132-1. When the gas ejecting unit 191-1 ejects inert gas and the upper surface of the film member TF is wrinkled, the wrinkles may be flattened. The gas ejecting unit 191-1 may eject inert gas from a center of the film member TF toward a side of the film member TF.

After the film member TF is flattened, a support chuck driver 170-1 may operate to bring the support chuck 160-1 into contact with a lower surface of the film member TF. In this case, the gas ejecting unit 191-1 may no longer operate. Also, the third linear driver 192-1 and the fourth linear driver 193-1 may move the gas ejecting unit 191-1 to another position from the upper surface of the film member TF.

When the support chuck 160-1 contacts the lower surface of the film member TF, the support chuck 160-1 may be provided in the form of a vacuum chuck or a porous chuck to fix the lower surface of the film member TF.

After the lower surface of the film member TF is fixed to the support chuck 160-1, a first linear driver 111-1 and a second linear driver 112-1 may operate to arrange a head unit 120-1 in a test region. Here, the gas ejecting unit 191-1, the first linear driver 111-1, and the second linear driver 112-1 may not interfere with each other.

After the head unit 120-1 has discharged droplets onto the film member TF, when the droplets are arranged on the upper surface of the film member TF, the sensing unit 180-1 may detect at least one of a shape, position, size, and volume of the droplets on the film member TF. The sensing unit 180-1 may linearly move, via the sensing driver 194-1, to a portion where the droplets arranged on the film member TF are positioned.

The droplets discharged from the head unit 120-1 may be controlled based on a result of the detection as described above. Next, when the head unit 120-1 discharges droplets that are identical or similar to those that are preset, the first linear driver 111-1 and the second linear driver 112-1 may move the head unit 120-1 from the test region to a process region. The head unit 120-1 may discharge droplets onto a substrate (not shown) to form at least one of various layers on the substrate (not shown) in the process region.

Thus, according to the apparatus 100-1 for manufacturing a display device and a method of manufacturing a display device, droplets of the head unit 120-1 may be accurately measured to control the head unit 120-1. In addition, according to the apparatus 100-1 for manufacturing a display device and the method of manufacturing a display device, as the upper surface of the film member TF is kept flat, distortion of at least one of the size, the shape, the volume, and the position of droplets due to the shape of the film member TF may be prevented.

FIGS. 15 through 18 are side views illustrating another exemplary embodiment of an operation of an apparatus for manufacturing a display device.

Referring to FIGS. 15 through 18, the apparatus 100-1 for manufacturing a display device may include a first roller 131-1, a second roller 132-1, a third roller 133-1, a fourth roller 134-1, a flatness maintainer (not shown), a sensing unit 180-1, a third linear driver 192-1, and a fourth linear driver 193-1. The first roller 131-1, the second roller 132-1, the third roller 133-1, the fourth roller 134-1, the third linear driver 192-1, and the fourth linear driver 193-1 are respectively identical to those described above with reference to FIGS. 11 through 14, and thus detailed description thereof will be omitted.

The flatness maintainer may include a gas ejecting unit 191-1 and a support chuck 160-1. Here, the gas ejecting unit 191-1 may be identical or similar to that described above with reference to FIGS. 11 through 14. The support chuck 160-1 may include a support bracket 162-1 and a transmitting portion 161-1. The support bracket 162-1 and the transmitting portion 161-1 may be respectively identical or similar to those described above with reference to FIG. 4.

The sensing unit 180-1 may be arranged inside the support bracket 162-1. A sensing driver 194-1 may be arranged in the support bracket 162-1 to linearly move the sensing unit 180-1. Although not illustrated in the drawing, the sensing driver 194-1 and the sensing unit 180-1 may also be arranged outside the support bracket 162-1. In this case, the sensing driver 194-1 may be arranged not to overlap a movement range of the support bracket 162-1.

In regard to an operation of the apparatus 100-1 for manufacturing a display device, as a roller driver (not shown) operates, the first roller 131-1 and the second roller 132-1 operate to arrange a portion of the film member TF, on which droplets are to be arranged, between the first roller 131-1 and the second roller 132-1.

Next, the third linear driver 192-1 and the fourth linear driver 193-1 may operate to arrange the gas ejecting unit 191-1 on an upper surface of the film member TF. The gas ejecting unit 191-1 may prevent the film member TF from being wrinkled, by ejecting an inert gas onto the upper surface of the film member TF and may flatten the wrinkled portion of the film member TF. The gas ejecting unit 191-1 may eject inert gas to the film member TF when the film member TF moves or eject inert gas to the film member TF after the film member TF is fixed.

Next, the third linear driver 192-1 and the fourth linear driver 193-1 may operate to remove the gas ejecting unit 191-1 from the upper surface of the film member TF. In addition, a support chuck driver 170-1 may operate to bring the support chuck 160-1 into contact with the film member TF and then fix the film member TF to the support chuck 160-1. The support chuck 160-1 may be provided in the form of a vacuum chuck or a porous chuck to fix the film member TF.

After an operation of the first linear driver 111-1 and the second linear driver 112-1 to arrange a head unit 120-1 in a test region, the head unit 120-1 may discharge droplets onto the film member TF. Next, the sensing driver 194-1 may be operated to adjust a position of the sensing unit 180-1, and then the droplets on the film member TF may be sensed using the sensing unit 180-1. In addition, the amount, shape, size, or the like of the droplets discharged from the head unit 120-1 may be controlled based on a result of the detection by the sensing unit 180-1.

Thus, according to the apparatus 100-1 for manufacturing a display device and a method of manufacturing a display device, droplets of the head unit 120-1 may be accurately measured to control the head unit 120-1. In addition, according to the apparatus 100-1 for manufacturing a display device and the method of manufacturing a display device, as the upper surface of the film member TF is kept flat, distortion of at least one of the size, the shape, the volume, and the position of droplets due to the shape of the film member TF may be prevented.

FIGS. 19 through 22 are side views illustrating another exemplary embodiment of an operation of an apparatus for manufacturing a display device.

Referring to FIGS. 19 through 22, the apparatus 100-1 for manufacturing a display device may include a first roller 131-1, a second roller 132-1, a third roller 133-1, a fourth roller 134-1, a flatness maintainer (not shown), a sensing unit 180-1, a third linear driver 192-1, and a fourth linear driver 193-1. The first roller 131-1, the second roller 132-1, the third roller 133-1, the fourth roller 134-1, the third linear driver 192-1, and the fourth linear driver 193-1 are respectively identical to those described above with reference to FIGS. 11 through 14, and thus detailed description thereof will be omitted.

The flatness maintainer may include a gas ejecting unit 191-1 and a support chuck 160-1. The gas ejecting unit 191-1 may be identical or similar to that described above with reference to FIGS. 11 through 14, and the support chuck 160-1 may include a support bracket 162-1 and a transmitting portion 161-1 in an identical or similar manner to that described above with reference to FIGS. 15 through 18.

The sensing unit 180-1 may include a first sensing portion 181-1 arranged on an upper surface of the film member TF and a second sensing portion 182-1 arranged on a lower surface of the film member TF. The first sensing portion 181-1 may be connected to a first sensing driver 194-1*a* to linearly move, and the second sensing portion 182-1 may be connected to a second sensing driver 194-1*b* to linearly move. In this case, the second sensing portion 182-1 and the second sensing driver 194-1*b* may be arranged in the support chuck 160-1.

In regard to an operation of the apparatus 100-1 for manufacturing a display device, as described above, at least one of the first roller 131-1 and the second roller 132-1 may be operated via a roller driver (not shown) to arrange a portion of the film member TF, on which droplets are to be dropped, between the first roller 131-1 and the second roller 132-1.

Next, the third linear driver 192-1 and the fourth linear driver 193-1 may be operated to arrange the gas ejecting unit 191-1 on the upper surface of the film member TF and eject inert gas onto the film member TF, thereby flattening the upper surface of the film member TF.

The third linear driver 192-1 and the fourth linear driver 193-1 may remove the gas ejecting unit 191-1 from the upper surface of the film member TF, and a support chuck driver 170-1 may raise the support chuck 160-1 to support the lower surface of the film member TF. The support chuck 160-1 may adsorb the lower surface of the film member TF to fix the film member TF.

The first linear driver 111-1 and the second linear driver 112-1 may locate a head unit 120-1 on the upper surface of the film member TF and then the head unit 120-1 may drop droplets onto the film member TF.

Next, the first sensing portion 181-1 and the second sensing portion 182-1 may detect the droplets of the film member TF. The head unit 120-1 may adjust the volume, size, shape, or the like of the dropping droplets based on a result of the detection.

When the above-described adjustment is completed, the first linear driver 111-1 and the second linear driver 112-1 may move the head unit 120-1 to a process region. Next, the head unit 120-1 may form at least one of various layers on a substrate (not shown).

Thus, according to the apparatus 100-1 for manufacturing a display device and a method of manufacturing a display device, droplets of the head unit 120-1 may be accurately measured to control the head unit 120-1. In addition, according to the apparatus 100-1 for manufacturing a display device and the method of manufacturing a display device, as the upper surface of the film member TF is kept flat, distortion of at least one of the size, the shape, the volume, and the position of droplets due to the shape of the film member TF may be prevented.

Although not illustrated in the drawing, the apparatus 100 for manufacturing a display device or the apparatus 100-1 for manufacturing a display device, as described above, may also include both the clamping unit 140 and the gas ejecting unit 191-1 at the same time.

Figure 23:
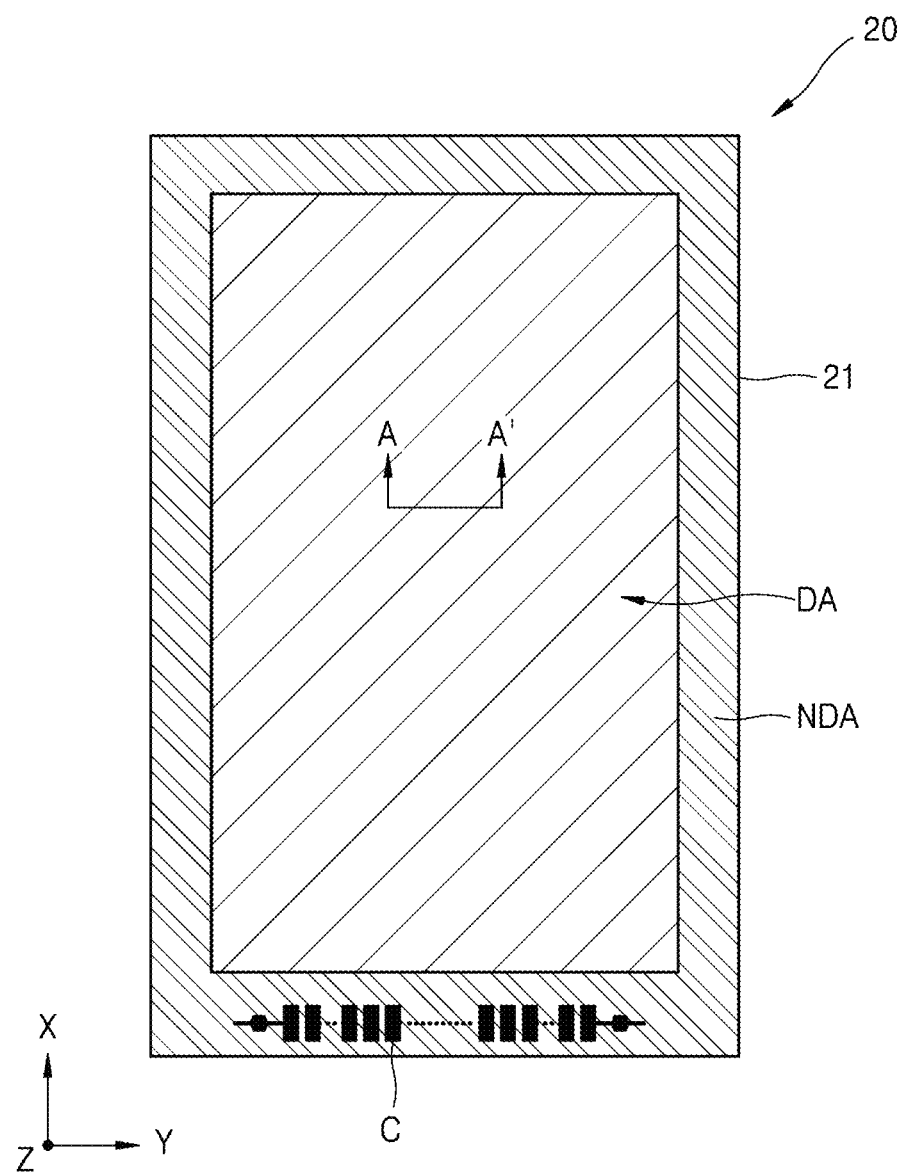
FIG. 23 is a plan view illustrating an exemplary embodiment of a display device manufactured by an apparatus for manufacturing a display device.
Figure 24:
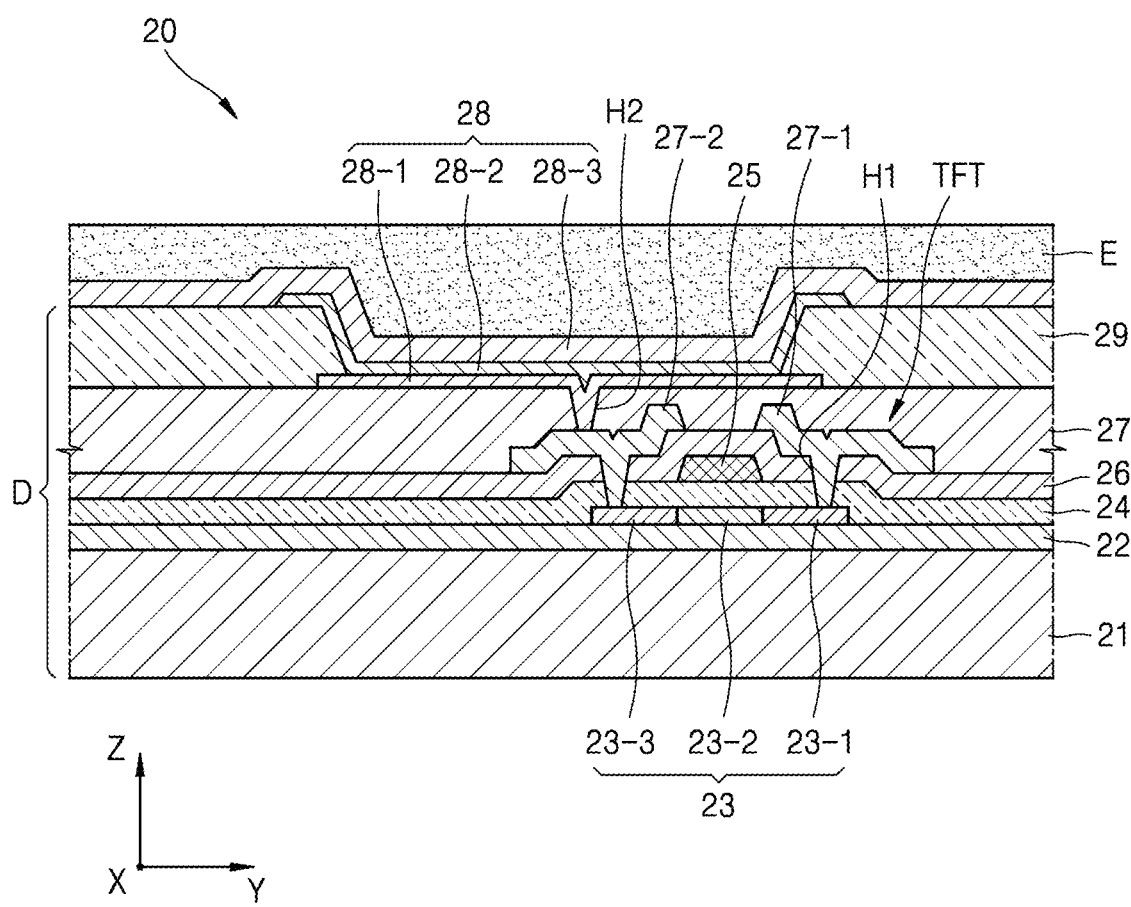
FIG. 24 is a cross-sectional view of the display device taken along line A-A' of FIG. 23.

FIG. 23 is a plan view illustrating an exemplary embodiment of a display device 20 manufactured by an apparatus for manufacturing a display device. FIG. 24 is a cross-sectional view of the display device 20 taken along line A-A' of FIG. 23.

Referring to FIGS. 23 and 24, in the display device 20, a display area DA and a non-display area NDA outside the display area DA may be defined on a substrate 21. A light-emitting unit may be arranged in the display area DA, and a power line (not shown) may be arranged in the non-display area NDA. Also, a pad unit C may be arranged in the non-display area NDA.

The display device 20 may include a display substrate D and a thin film encapsulation layer E. The display substrate D may include the substrate 21, a thin film transistor TFT, a passivation layer 27, and a pixel electrode 28-1. In another exemplary embodiment, the display substrate D may include some of the substrate 21, the thin film transistor TFT, the passivation layer 27, the pixel electrode 28-1, and an intermediate layer 28-2. In another exemplary embodiment, the display substrate D may include the substrate 21, the thin film transistor TFT, the passivation layer 27, the pixel electrode 28-1, and the intermediate layer 28-2. Hereinafter, for convenience of description, the display substrate D including the substrate 21, the thin film transistor TFT, the passivation layer 27, and the pixel electrode 28-1 will be described in detail.

In an exemplary embodiment, the substrate 21 may include plastic or a metal such as stainless steel ("SUS") or titanium (Ti). Also, the substrate 21 may include polyimide ("PI"). Hereinafter, for convenience of description, the substrate 21 including PI will be described in detail.

The thin film transistor TFT may be disposed on the substrate 21, and the passivation layer 27 may be provided to cover the thin film transistor TFT, and an organic light-emitting device ("OLED") 28 may be disposed on the passivation layer 27.

In an exemplary embodiment, a buffer layer 22 including an organic compound and/or an inorganic compound is further disposed on an upper surface of the substrate 21 and includes $SiO_x$ (x≥1) or $SiN_x$ (x≥1), for example.

After an active layer 23 arranged in a pattern is provided on the buffer layer 22, the active layer 23 is buried by a gate insulating layer 24. The active layer 23 includes a source area 23-1 and a drain area 23-3 and also a channel area 23-2 therebetween.

The active layer 23 may include various materials. In an exemplary embodiment, the active layer 23 may include an inorganic semiconductor material such as amorphous silicon or crystalline silicon, for example. As another example, the active layer 23 may include an oxide semiconductor. As another example, the active layer 23 may include an organic semiconductor material. Hereinafter, for convenience of description, the active layer 23 including amorphous silicon will be described in detail.

The active layer 23 may be provided by forming an amorphous silicon layer on the buffer layer 22 and crystallizing the amorphous silicon layer into a polycrystalline silicon layer and patterning the polycrystalline silicon layer. The source area 23-1 and the drain area 23-3 of the active layer 23 are doped with impurities according to a TFT type such as a driving TFT (not shown), a switching TFT (not shown), or the like.

A gate electrode 25 corresponding to the active layer 23 and an interlayer insulating layer 26 burying the gate electrode 25 are disposed on an upper surface of the gate insulating layer 24.

Also, after defining a contact hole H1 in the interlayer insulating layer 26 and the gate insulating layer 24, a source electrode 27-1 and a drain electrode 27-2 are disposed on the interlayer insulating layer 26 to respectively contact the source area 23-1 and the drain area 23-3.

The passivation layer 27 is disposed on the thin film transistor TFT provided as described above, and the pixel electrode 28-1 of the OLED 28 is disposed on the passivation layer 27. The pixel electrode 28-1 contacts the drain electrode 27-2 of the thin film transistor TFT via a via hole H2 defined in the passivation layer 27. The passivation layer 27 may include an inorganic material and/or an organic material and in a single-layer or two or more layers. The passivation layer 27 may include a planarization layer such that an upper surface thereof is flat regardless of the unevenness of underlying layers or may be uneven according to the unevenness of underlying layers. Also, the passivation layer 27 may include a transparent insulator to achieve resonance effects.

After the pixel electrode 28-1 is disposed on the passivation layer 27, a pixel defining layer 29 includes an organic material and/or an inorganic material to cover the pixel electrode 28-1 and the passivation layer 27 and partially expose the pixel electrode 28-1.

Also, the intermediate layer 28-2 and an opposite electrode 28-3 are disposed at least on the pixel electrode 28-1. In another exemplary embodiment, the opposite electrode 28-3 may be disposed on the entire surface of the display substrate D. In this case, the opposite electrode 28-3 may be disposed on the intermediate layer 28-2 and the pixel defining layer 29. Hereinafter, for convenience of description, the opposite electrode 28-3 disposed on the intermediate layer 28-2 and the pixel defining layer 29 will be described in detail.

The pixel electrode 28-1 functions as an anode electrode, and the opposite electrode 28-3 functions as a cathode electrode. Polarities of the pixel electrode 28-1 and the opposite electrode 28-3 may also be exchanged.

The pixel electrode 28-1 and the opposite electrode 28-3 are insulated from each other via the intermediate layer 28-2, and voltages of different polarities may be applied to the intermediate layer 28-2 to emit light from an organic emission layer.

The intermediate layer 28-2 may include an organic emission layer. In another exemplary embodiment, the intermediate layer 28-2 may include an organic emission layer, and may further include at least one of a hole injection layer, a hole transport layer, an electron transport layer, and an electron injection layer. However, the invention is not limited thereto, and the intermediate layer 28-2 may include an organic emission layer and other various functional layers (not shown).

A plurality of intermediate layers 28-2 may be included, and the plurality of intermediate layers 28-2 may form the display area DA. In particular, the plurality of intermediate layers 28-2 may form the display area DA having a shape except for a rectangular or square shape. The plurality of intermediate layers 28-2 may be arranged to be spaced apart from each other in the display area DA.

One unit pixel includes a plurality of sub-pixels, and the plurality of sub-pixels may emit light of various colors. In an exemplary embodiment, the plurality of sub-pixels may include sub-pixels respectively emitting red, green, and blue light and a sub-pixel (not shown) emitting red, green, blue, and white light, for example.

Although not illustrated in the drawing, a capping layer (not shown) may be arranged over the opposite electrode 28-3. The capping layer may have a lower refractive index than that of the opposite electrode 28-3 and reduce a ratio that light emitted from the intermediate layer 28-2 including the organic emission layer is totally internally reflected and not emitted to the outside, thereby increasing light efficiency.

In an exemplary embodiment, the capping layer may include an organic material such as poly(3,4-ethylenedioxythiophene) ("PEDOT"), 4,4'-bis[N-(3-methylphenyl)-N-phenylamino]biphenyl ("TPD"), 4,4',4"-tris[(3-methylphenyl) phenylamino]triphenylamine ("m-MTDATA"), 1,3,5-tris[N,N-bis(2-methylphenyl)-amino]-benzene ("o-MTDAB"), 1,3,5-tris[N,N-bis(3-methylphenyl)-amino]-benzene ("m-MTDAT"), 1,3,5-tris[N,N-bis(4-methylphenyl)-amino]-benzene ("p-MTDAB"), 4,4'-bis[N,N-bis(3-methylphenyl)-amino]-diphenylmethane ("BPPM"), 4,4'-dicarbazolyl-1,1'-biphenyl ("CBP"), 4,4',4"-tris(N-carbazole) triphenylamine ("TCTA"), 2,2',2'-(1,3,5-benzenetolyl) tris-[1-phenyl-1H- benzoimidazole] ("TPBI"), and 3-(4-biphenyl)-4-phenyl-5-t-butylphenyl-1,2,4-triazole ("TAZ"), for example.

In an alternative exemplary embodiment, the capping layer may include an inorganic material such as zinc oxide, titanium oxide, zirconium oxide, silicon nitride, niobium oxide, tantalum oxide, tin oxide, nickel oxide, indium nitride, and gallium nitride, for example. The materials for forming the capping layer are not limited thereto, and other various materials may be used to form the capping layer.

A cover layer (not shown) may be arranged over the capping layer. The cover layer protects the OLED 28 from damage that may occur in a subsequent process performed using plasma or the like. In an exemplary embodiment, the cover layer may include lithium fluoride (LiF), for example.

The thin film encapsulation layer E may include a plurality of inorganic layers or an inorganic layer and an organic layer.

The organic layer of the thin film encapsulation layer E may include a polymer, and may be a single layer or a stacked layer including any one of polyethylene terephthalate, polyimide, polycarbonate, epoxy, polyethylene, and polyacrylate. The organic layer may include polyacrylate, and specifically, may include a polymerized monomer composition including a diacrylate-based monomer and a triacrylate-based monomer. The monomer composition may further include a monoacrylate-based monomer. Also, the monomer composition may further include a well-known photo-initiator such as thermoplastic olefin ("TPO"), but is not limited thereto.

The inorganic layer of the thin film encapsulation layer E may be a single layer or a stacked layer including a metal oxide or a metal nitride. In an exemplary embodiment, the inorganic layer may include any one of $SiN_x$, $Al_2O_3$, $SiO_2$, and $TiO_2$, for example.

An uppermost layer included in the thin film encapsulation layer E and exposed to the outside may include an inorganic layer to prevent permeation of moisture into the OLED 28.

The thin film encapsulation layer E may include at least one sandwich structure in which at least one organic layer is between at least two inorganic layers. As another example, the thin film encapsulation layer E may include at least one sandwich structure in which at least one inorganic layer is between at least two organic layers. As another example, the thin film encapsulation layer E may include a sandwich structure in which at least one organic layer is between at least two inorganic layers and a sandwich structure in which at least one inorganic layer is between at least two organic layers.

The thin film encapsulation layer E may sequentially include, from an upper portion of the OLED 28, a first inorganic layer, a first organic layer, and a second inorganic layer.

As another exemplary embodiment, the thin film encapsulation layer E may sequentially include, from an upper portion of the OLED 28, a first inorganic layer, a first organic layer, a second inorganic layer, a second organic layer, and a third inorganic layer.

As another exemplary embodiment, the thin film encapsulation layer E may sequentially include, from an upper portion of the OLED 28, a first inorganic layer, a first organic layer, a second inorganic layer, a second organic layer, a third inorganic layer, a third organic layer, and a fourth inorganic layer.

The first organic layer may have a smaller area than that of the second inorganic layer, and the second organic layer may also have a smaller area than that of the third inorganic layer.

Although not illustrated in the drawing, the display device 20 may also include, instead of the thin film encapsulation layer E, a sealing member arranged on the substrate 21 and an encapsulation substrate (not shown) attached to the sealing member. A plurality of intermediate layers and thin film transistors may be arranged between the substrate 21 and the encapsulation substrate.

At least one layer of the display device 20 may be provided using the apparatus (not shown) for a display device, as described above. In an exemplary embodiment, one of an organic layer or an inorganic layer of the display device 20 may be provided using the apparatus for a display device.

Thus, a precise image may be implemented using the display device 20, for example.

According to the apparatus for a display device and the method of manufacturing a display device, in the exemplary embodiments, droplets of a precise pattern may be dropped onto a display device. In addition, according to the apparatus for a display device and the method of manufacturing a display device, in the exemplary embodiments, a precise pattern may be implemented.

It should be understood that embodiments described herein should be considered in a descriptive sense only and not for purposes of limitation. Descriptions of features or exemplary embodiments within each embodiment should typically be considered as available for other similar features or other exemplary embodiments. While one or more exemplary embodiments have been described with reference to the drawing figures, it will be understood by those of ordinary skill in the art that various changes in form and details may be made therein without departing from the spirit and scope as defined by the following claims.

What is claimed is:

1. A method of manufacturing a display device, the method comprising:
    moving a film member by rotating one of a first roller unwinding the film member and a second roller around which the film member is wound;
    stopping the film member by stopping at least one of the first roller and the second roller;
    tensioning the film member by clamping a side of the film member;
    discharging droplets onto the film member;
    detecting the droplets on the film member; and
    controlling droplets discharged from a head unit based on a result of the detecting the droplets.

2. The method of claim 1,
    wherein at least one of a size, a volume, a position, and a shape of the droplets is detected.

3. The method of claim 1,
    wherein a force is applied to the side of the film member at at least one side portion of the film member in a direction perpendicular to a transport direction of the film member and in a same plane defining the film member.

4. The method of claim 1,
    further comprising supporting the film member on a lower surface of the film member.

5. The method of claim 4,
    wherein the lower surface of the film member is supported using a support chuck.

6. The method of claim 5,
wherein the support chuck comprises at least one of a vacuum chuck and a porous chuck.

7. The method of claim 5,
wherein a portion of the support chuck arranged to face the lower surface of the film member is transparent.

8. The method of claim 1,
further comprising capturing an image of the droplets by a sensing unit to detect the droplets.

9. The method of claim 8,
wherein the sensing unit is arranged on at least one of an upper surface of the film member and a lower surface of the film member.

10. A method of manufacturing a display device, the method comprising:
moving a film member by rotating one of a first roller unwinding the film member and a second roller around which the film member is wound;
stopping the film member by stopping at least one of the first roller and the second roller;
keeping the film member flat by ejecting inert gas onto an upper surface of the film member;
discharging droplets onto the film member; and
detecting the droplets on the film member.

11. The method of claim 10,
further comprising controlling droplets discharged from a head unit based on a result of the detecting the droplets.

12. The method of claim 10,
wherein at least one of a size, a volume, a position, and a shape of the droplets is detected.

13. The method of claim 10,
further comprising supporting the film member on a lower surface of the film member.

14. The method of claim 13,
wherein the lower surface of the film member is supported using a support chuck.

15. The method of claim 14,
wherein the support chuck comprises at least one of a vacuum chuck and a porous chuck.

16. The method of claim 14,
wherein a portion of the support chuck arranged to face the lower surface of the film member is transparent.

17. The method of claim 10,
further comprising capturing an image of the droplets by a sensing unit to detect the droplets.

18. The method of claim 17,
wherein the sensing unit is arranged on at least one of the upper surface of the film member and a lower surface of the film member.

19. An apparatus for manufacturing a display device, the apparatus comprising:
a head unit;
a first roller from which a film member is unwound;
a second roller around which the film member is wound;
a flatness maintainer which is arranged between the first roller and the second roller and keeps at least one of an upper surface and a lower surface of the film member, flat;
a sensing unit which is arranged on at least one of the upper surface of the film member and the lower surface of the film member and detects droplets dropped from the head unit onto the film member; and
a controller for controlling the droplets discharged from the head unit based on the measurement result of the droplets discharged from the head unit.

20. The apparatus of claim 19,
wherein the flatness maintainer comprises a clamping unit which applies a force to a side of the film member.

21. The apparatus of claim 20,
wherein the clamping unit applies a force to the film member in a direction perpendicular to a transport direction of the film member and in a same plane defining the film member.

22. The apparatus of claim 20, further comprising a plurality of clamping units,
wherein
the plurality of clamping units is arranged to be spaced apart from each other in a transport direction of the film member.

23. The apparatus of claim 19,
wherein the flatness maintainer comprises a gas ejecting unit which is arranged on the upper surface of the film member and ejects inert gas onto the upper surface of the film member.

24. The apparatus of claim 19,
wherein the flatness maintainer comprises a support chuck which is arranged on the lower surface of the film member and contacts the lower surface of the film member to support the lower surface of the film member.

25. The apparatus of claim 19,
wherein a position of the sensing unit is variable.

* * * * *